(12) United States Patent
Yamayoshi et al.

(10) Patent No.: US 8,384,086 B2
(45) Date of Patent: Feb. 26, 2013

(54) METHOD OF CRYSTALLIZING AMORPHOUS SEMICONDUCTOR FILM, THIN-FILM TRANSISTOR, SEMICONDUCTOR DEVICE, DISPLAY DEVICE, AND METHOD OF MANUFACTURING THE SAME

(75) Inventors: Kazushi Yamayoshi, Tokyo (JP); Toru Takeguchi, Tokyo (JP); Kazutoshi Aoki, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 146 days.

(21) Appl. No.: 12/888,779

(22) Filed: Sep. 23, 2010

(65) Prior Publication Data

US 2011/0079780 A1 Apr. 7, 2011

(30) Foreign Application Priority Data

Oct. 1, 2009 (JP) ................. 2009-229635

(51) Int. Cl.
*H01L 27/108* (2006.01)
(52) U.S. Cl. .................. 257/69; 257/E29.151
(58) Field of Classification Search .......... 257/51, 257/59, 64, 69, 291, 292, E51.005, E29.151
See application file for complete search history.

(56) References Cited

U.S. PATENT DOCUMENTS

| 6,949,422 | B2 | 9/2005 | Kim | |
|---|---|---|---|---|
| 7,629,207 | B2 * | 12/2009 | Lim et al. | 438/151 |
| 7,915,689 | B2 * | 3/2011 | Cho et al. | 257/390 |

FOREIGN PATENT DOCUMENTS

| JP | 63-11989 | 1/1988 |
|---|---|---|
| JP | 8-125192 | 5/1996 |
| JP | 2004-214677 | 7/2004 |

OTHER PUBLICATIONS

Takuo Kaitoh, et al. "69.4: Invited Paper: SELAX Technology for Poly-Si TFTs Integrated with Amorphous-Si TFTs." SID 08 Digest. 2008. pp. 1066-1069.

* cited by examiner

*Primary Examiner* — Quoc Hoang
(74) *Attorney, Agent, or Firm* — Oblon, Spivak, McClelland, Maier & Neustadt, L.L.P.

(57) ABSTRACT

A method of crystallizing an amorphous semiconductor film, the method comprising the steps of: forming a gate electrode on a transparent insulating substrate; forming a gate insulating film on the transparent insulating substrate and on an upper part of the gate electrode; forming an amorphous semiconductor film on the gate insulating film; forming a light-transmissive insulating film on the amorphous semiconductor film; forming a metal film having an opening on the light-transmissive insulating film; irradiating laser light onto both a region of the light-transmissive insulating film exposed by the opening and the metal film, which is used as a mask for shielding the laser light; and performing laser annealing to make the laser light to be absorbed through the light-transmissive insulating film into a region of the amorphous semiconductor film exposed by the opening, so that the amorphous semiconductor film is heated and converted to a crystalline semiconductor film.

4 Claims, 13 Drawing Sheets

METHOD OF CRYSTALLIZING AMORPHOUS SEMICONDUCTOR FILM, THIN-FILM TRANSISTOR, SEMICONDUCTOR DEVICE, DISPLAY DEVICE, AND METHOD OF MANUFACTURING THE SAME

CROSS-REFERENCE TO RELATED APPLICATION

This application claims priority from Japanese Patent Application No. 2009-229635 filed on Oct. 1, 2009, the entire subject matter of which is incorporated herein by reference.

BACKGROUND

1. Technical Field

The present invention relates to a method of crystallizing an amorphous semiconductor film, a thin-film transistor (hereinafter, referred to as TFT), a semiconductor device, and a display device using the same, and a method of manufacturing the same.

2. Description of the Related Art

In recent years, a liquid crystal display, called as a drive circuit-integrated type has come into practical use. In the drive circuit-integrated type liquid crystal display, a drive circuit configured by a drive TFT, which is formed simultaneously with a pixel TFT arranged in a pixel, is integrated in a peripheral portion around a pixel portion so as to quite an externally mounted drive IC. In many cases, such a liquid crystal display is used as a small liquid crystal display or the like. In such a liquid crystal display, with regard to the drive TFT, it is necessary to realize a drive speed for operation of the drive circuit, so that a polycrystalline silicon TFT, which is excellent in drive capability compared to an amorphous silicon TFT (hereinafter, referred to as amorphous TFT) used for a pixel TFT heretofore. Further, from the viewpoint of manufacturing cost, since it is advantageous to simultaneously form the pixel TFT and the drive TFT, there are many cases where a polycrystalline silicon TFT is used for the pixel TFT in accordance with the demand for the drive TFT. On the other hand, with regard to the pixel TFT, high electric field effect mobility or low threshold voltage shift of the polycrystalline silicon TFT is not very necessary. Meanwhile, the polycrystalline silicon TFT has large characteristic variations or leak current compared to the amorphous TFT. For this reason, when the polycrystalline silicon TFT is used for the pixel TFT, display unevenness or the like occurs, thus it is not always easy to use the polycrystalline silicon TFT for the pixel TFT. Thus, when the polycrystalline silicon TFT is used for the drive TFT, and also the polycrystalline silicon TFT is used for the pixel TFT, it is necessary to introduce the latest technique or to perform excessive manufacturing management so as to suppress characteristic variations or leak current of the polycrystalline silicon TFT, causing an enormous increase in manufacturing cost. That is, the pixel TFT and the drive TFT have to have different TFT characteristics, thus it takes a lot of effort and manufacturing cost to manufacture the same TFT which meets the demands for the pixel TFT and the drive TFT.

In such a situation, there is demand for a resolution which realizes different TFT characteristics for the pixel TFT and the drive TFT by comparatively slightly changing the manufacturing method of one of the pixel TFT and the drive TFT while suppressing an increase in manufacturing cost. As such resolution, JP-A-S63-11989 and "SELAX Technology for Poly-Si TFTs Integrated with Amorphous-Si TFTs, 2008 SID" disclose a method in which a pixel TFT is formed by an amorphous TFT as heretofore, and only for a drive TFT, amorphous silicon is converted to polycrystalline silicon during the manufacturing process, so as to form the drive TFT by a polycrystalline silicon TFT. JP-A-H08-125192 discloses a method in which a metal mask is arranged on an insulating substrate, and only an opening is irradiate with laser, so that an aligned only onto a drive circuit portion. And a method in which Ni atoms for redundant crystallization are supplied only to a necessary portion using an $SiO_2$ film formed on an insulating substrate by patterning as a mask so as to selectively obtain films having different crystallinities.

However, although JP-A-S63-11989 and "SELAX Technology for Poly-Si TFTs Integrated with Amorphous-Si TFTs 2008 SID" have disclosed the technique in which the polycrystalline silicon TFT is used only for the drive TFTs in the drive circuit regions, there are various practical technical problems in practice. That is, since a liquid crystal display is arranged in an array on the transparent insulating substrate, the drive circuit regions are not arranged continuously. Thus, the drive circuit regions are arranged to be dotted on the transparent insulating substrate. Accordingly, the transparent insulating substrate is moved to align the laser irradiation position with the drive circuit region, and the amorphous silicon is converted to the polycrystalline silicon through the laser irradiation. And then, the transparent insulating substrate is moved for alignment of the laser irradiation position with the next drive circuit region. Therefore, the movement and alignment of the transparent insulating substrate and the laser irradiation have to be repeated in accordance with the number of regions where amorphous silicon has to be converted to polycrystalline silicon. For each liquid crystal display, the arrangement of the drive circuits may differs in the position or region on the transparent insulating substrate. Specifically, in the case of a small liquid crystal display for use in a mobile phone or the like, the drive circuit region is narrowed, and thus higher positional accuracy of the laser irradiation has to be provided. To the contrary, considering the current positional accuracy of the laser irradiation, if polycrystalline silicon conversion is carried out only in the drive circuit region, the drive circuit region and the display region have to be far away from each other given the prospect of the amount of the laser irradiation position gap. Accordingly, the frame region other than the display region is extended, and it is impossible to achieve reduction in the dimension of the frame region for the latest liquid crystal display. Further, in manufacturing a small liquid crystal display, from the viewpoint of mass production efficiency, a manufacturing method is generally used in which enormous pieces are obtained (simultaneously formed) from a single transparent insulating substrate. Accordingly, a plurality of laser irradiation positions have to be provided for respective liquid crystal displays. Such a method is not practical, because it takes a lot of time to perform the laser irradiation operation, and thus productivity is deterioneted. That is, even when a laser device having positional accuracy beyond the positional accuracy of the drive circuit region is used, it is difficult to achieve practical use along with mass production.

According to JP-A-H08-125192, a silicon oxide film formed by patterning is used as a mask, thus Ni atoms for redundant crystallization can be supplied to a portion necessary for crystallization with high accuracy. However, a laser operation for crystallization is selectively performed through a metal mask positioned at an interval on the insulating substrate. Consequently, the mask holding method or positioning method is mechanically realized similarly to a positional accuracy of the laser irradiation, thus it is difficult to meet the positional accuracy for the drive circuit region. Further, it is expected that the laser light passing through the opening is diffracted due to the distance between the metal mask and the insulating substrate. Thus, it can be easily inferred that, when a region where the quality of laser light is deteriorated due to the effect of light leakage or interference (a region where evenness is collapsed from a desired laser power) is taken into consideration, the effective positional accuracy is equal to or greater than several hundred micro meters. Further, there is concern that a pixel TFT in a portion close to the drive circuit region undergoes changes in crystallinity due to the effect of the laser light leaking from the metal mask and consequently undergoes deterioration, such as display unevenness. When display unevenness is not tolerable, the peripheral drive circuit and the display section cannot be arranged to be close to each other. Thus, it is also impossible to prevent an increase in the dimension of the frame region other than the display region and to meet the demand for reduction in the dimension of the frame region. In addition, from the viewpoint of the effective positional accuracy that is regarded as being equal to or greater than several hundred micro meters, it is impossible to meet the design of an arrangement in which the drive circuit portions and the pixel TFTs are mixed at the micro level. Furthermore, as inferable that it is difficult to convert amorphous silicon to polycrystalline silicon in adjacent TFTs, in the semiconductor layer of a single TFT, it is impossible to convert only a portion of the semiconductor layer from amorphous silicon to polycrystalline silicon. As described above, in the method disclosed by JP-A-H08-125192, it is difficult to realize the close arrangement of the drive circuit portion and the pixel TFT or the structure in which amorphous silicon and polycrystalline silicon are mixed in a single semiconductor layer.

SUMMARY

In order to solve the above-described problems, an object of the invention is to provide: a silicon crystallization method of selectively crystallizing one of semiconductor films arranged to be close to each other with high accuracy; a TFT, a semiconductor device and a display device using the same; and a method of manufacturing the same. For example, it is possible that converting only one TFT of TFTs arranged in a peripheral drive circuit and a display section to polycrystalline silicon in a display device in which the peripheral drive circuit and the display section are arranged to be close to each other.

A method of crystallizing an amorphous semiconductor film in the present invention, the method comprising the steps of: forming a gate electrode on a transparent insulating substrate; forming a gate insulating film on the transparent insulating substrate and on an upper part of the gate electrode; forming an amorphous semiconductor film on the gate insulating film; forming a light-transmissive insulating film on the amorphous semiconductor film; forming a metal film having an opening on the light-transmissive insulating film; irradiating laser light onto both a region of the light-transmissive insulating film exposed by the opening and the metal film, which is used as a mask for shielding the laser light; and performing laser annealing to make the laser light to be absorbed through the light-transmissive insulating film into a region of the amorphous semiconductor film exposed by the opening, so that the amorphous semiconductor film is heated and converted to a crystalline semiconductor film.

According to the aspect of the invention, a metal film having an opening formed by patterning is irradiated with the laser to crystallize an amorphous semiconductor film, so that only one of the semiconductor films arranged to be close to each other or only a portion of one semiconductor film can be selectively crystallized with high accuracy.

DETAILED DESCRIPTION OF THE EMBODIMENTS

First Embodiment

Figure 1:
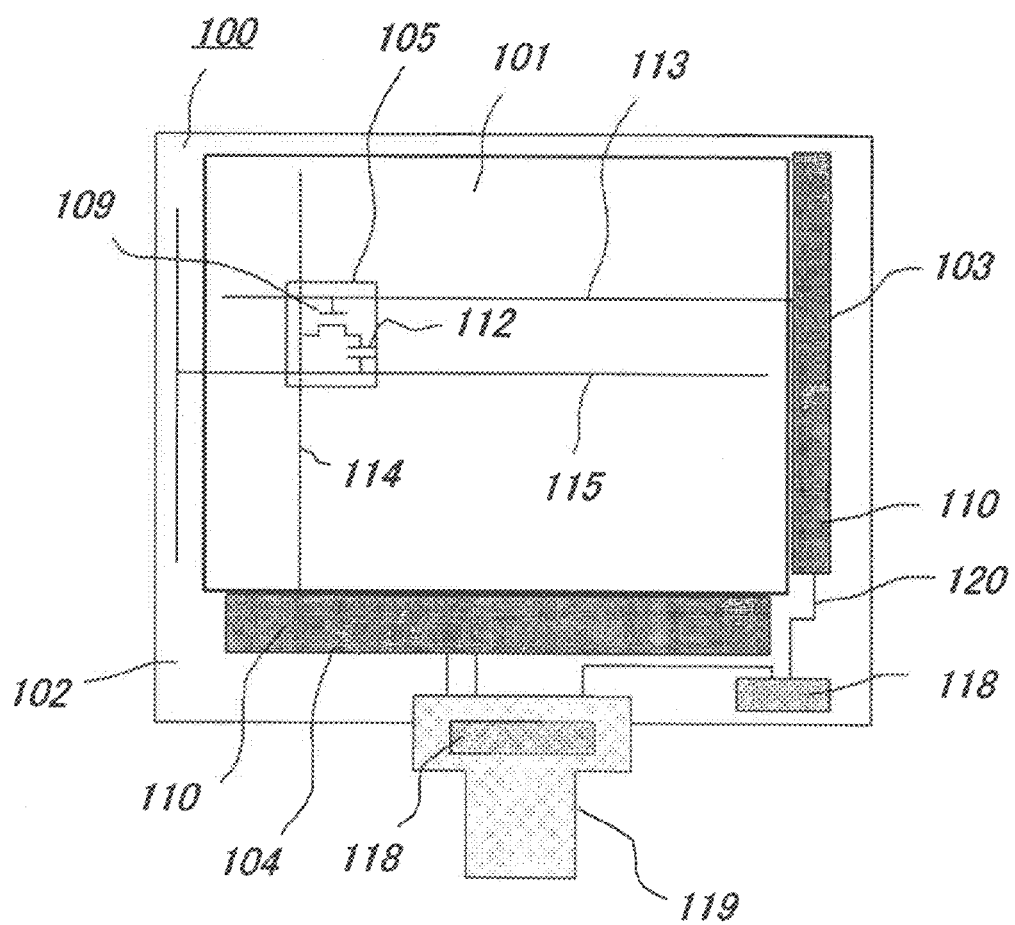
FIG. 1 is a plan view showing a liquid crystal display panel in a liquid crystal display according to a first embodiment of the invention.

As a first embodiment of the invention, a case will be described where the invention is applied to a semiconductor device using a TFT and a liquid crystal display which is an example of a display device. In the first embodiment, a description will be provided for a case where the invention is applied to a general liquid crystal display. FIG. 1 is a schematic plan view showing the configuration of a liquid crystal display panel in the liquid crystal display according to the first embodiment of the invention. The drawing is schematic, and the accurate size of each of the constituent elements will not be reflected in the drawing. In order to eliminate complexity from the drawing, parts other than the main parts of the invention will be omitted or the configuration will be partially simplified in an appropriate manner. The same manner is applied to the following drawings. In addition, in the following drawings, the same constituent elements as those described in the preceding drawings are represented by the same reference numerals, and description thereof will be omitted.

In the liquid crystal display panel of the first embodiment, two transparent insulating substrates such as glass substrates are arranged to face each other. As shown in FIG. 1, in one side of transparent insulating substrate, pixel TFTs 109 are arranged to correspond to pixels each of which becomes the unit for image display. The pixel TFTs 109 serve as switching elements to control switching on and off of the supply of the display voltage applied to the liquid crystal. The pixel TFTs 109 are arranged in an array for the respective pixels, thus a substrate on which the pixel TFTs 109 are arranged is called an array substrate 100. The array substrate 100 is provided with a display section 101, where an image is displayed, and a frame region 102, which is provided so as to surround the display section 101. In the display section 101, a plurality of gate lines (scan signal lines) 113, a plurality of storage capacitor lines 115, and a plurality of source lines (display signal lines) 114 are formed.

The plurality of gate lines 113 and the plurality of storage capacitor lines 115 are arranged to face each other and provided in parallel to each other. The gate lines 113 and the storage capacitor lines 115 are arranged so as to be orthogonal to the source lines 114. A region surrounded by the adjacent gate line 113 and the storage capacitor line 115 and the adjacent source lines 114 becomes a pixel 105. In the array substrate 100, the pixels 105 are arranged in a matrix.

In each pixel 105, at least one pixel TFT 109 and a storage capacitor 112 connected to the pixel TFT 109 are formed to be connected in series to each other. The pixel TFT 109 serves as a switching element for supplying a display voltage to a pixel electrode. A gate electrode of the pixel TFT 109 is connected to the gate line 113, and the pixel TFT 109 is controlled to be turned on and off in accordance with a gate signal supplied from the gate line 113. A source electrode of the pixel TFT 109 is connected to the source line 114. If the pixel TFT 109 is turned on, a current flows from the source electrode of the pixel TFT 109 toward the drain electrode. Thus, the display voltage is applied to the pixel electrode connected to the drain electrode. Then, an electric field based on the display voltage is generated between the pixel electrode and a counter electrode. The storage capacitor 112 is connected in parallel to the pixel electrode. Thus, a voltage is applied to the storage capacitor 112 at the same time a voltage is applied to the pixel electrode, so that the storage capacitor 112 can hold charges for a predetermined time.

In the frame region 102 of the array substrate 100, a scan signal drive circuit 103 and a display signal drive circuit 104 are provided. The scan signal drive circuit 103 and the display signal drive circuit 104 are formed by drive TFTs 110, which formed simultaneously with the pixel TFTs 109 in the display section 101. The gate lines 113 are provided to extend from the display section 101 to the frame region 102. The gate lines 113 are connected to the scan signal drive circuit 103. Similarly, the source lines 114 are provided to extend from the display section 101 and connected to the display signal drive circuit 104.

The pixel TFT 109 and the drive TFT 110 which are features in the liquid crystal display of the first embodiment will be described. The pixel TFT 109 of the first embodiment is formed by an amorphous TFT suitable for operation of the display pixel. Meanwhile, the drive TFT 110 forming the scan signal drive circuit 103 and/or the display signal drive circuit 104 is formed by a microcrystalline silicon TFT having small threshold voltage shift. Further, in the array substrate 100, the display section 101, where the pixel TFT 109 formed by the amorphous TFT, is arranged and the scan signal drive circuit 103 and/or the display signal drive circuit 104, where the drive TFT 110 formed by the microcrystalline silicon TFT is arranged, are arranged to be close to each other. Specifically, the amorphous TFT and the microcrystalline silicon TFT forming the respective circuits are partially arranged to be close to each other within a distance that goes beyond the positional accuracy of the laser irradiation (the degree of close arrangement generally satisfies about 1 mm or less in comparison with the current positional accuracy of the laser irradiation level). Incidentally, since the detailed structure or manufacturing method of the pixel TFT 109 and the drive TFT 110 will be described below in detail, hereinafter, other configuration regarding an overall of the liquid crystal display will be first described.

As another configuration, external lines 120 from the scan signal drive circuit 103 and/or the display signal drive circuit 104 are connected to external terminals at the end of the array substrate 100. An IC chip 118 or a printed board 119 is mounted on and electrically connected to the external terminals. Thus, various signals are supplied from the printed board 119 through the external terminals and supplied from the outside to the scan signal drive circuit 103 and the display signal drive circuit 104. Gate signals (scan signals) are supplied to the gate lines 113 on the basis of the signals, and the TFTs 109 are sequentially selected. Similarly, display signals are supplied to the source lines 114, and a display voltage based on display data is supplied to the respective pixels 105. An alignment film is formed on the outermost surface of the array substrate 100. The array substrate 100 is configured as described above.

Though not shown and described, a counter substrate is arranged to face the array substrate 100. The counter substrate is, for example, a color filter substrate, and is arranged on the viewing side. On the counter substrate, color resist (color material), a black matrix (BM), a counter electrode, an alignment film, etc., are formed. For example, as in an IPS type (horizontal field type) liquid crystal display, the counter electrode may be arranged on the array substrate 100. Liquid crystal is filled between the array substrate 100 and the counter substrate. Polarizing plates are attached on the external sides of the array substrate 100 and the counter substrate. A liquid crystal display panel is configured as described above. Further, a backlight unit is arranged on the opposite side to the viewing side of the liquid crystal display panel configured as described above through an optical film, such as a retardation film. The liquid crystal display panel and the peripheral members are appropriately accommodated in a frame made of resin or metal. The liquid crystal display of the first embodiment is configured as described above.

Subsequently, the display operation of the liquid crystal display of the first embodiment will be simply described. Liquid crystal is driven in accordance with an electric field between the pixel electrode and the counter electrode. That is, the alignment of liquid crystal between the substrates is changed, and the quantity of light passing through liquid crystal is changed. Specifically, a part of transmitted light from the backlight unit transmitting the liquid crystal display panel, the quantity of light transmitting the viewing-side polarizing plate is changed. The alignment direction of liquid crystal is changed in accordance with the applied display voltage. Therefore, the quantity of light transmitting the viewing-side polarizing plate can be changed by controlling the display voltage. That is, the quantity of light which is viewed as an image can be controlled. The sequence of operations contributes to holding of the display voltage in the storage capacitor 112.

Figure 2:
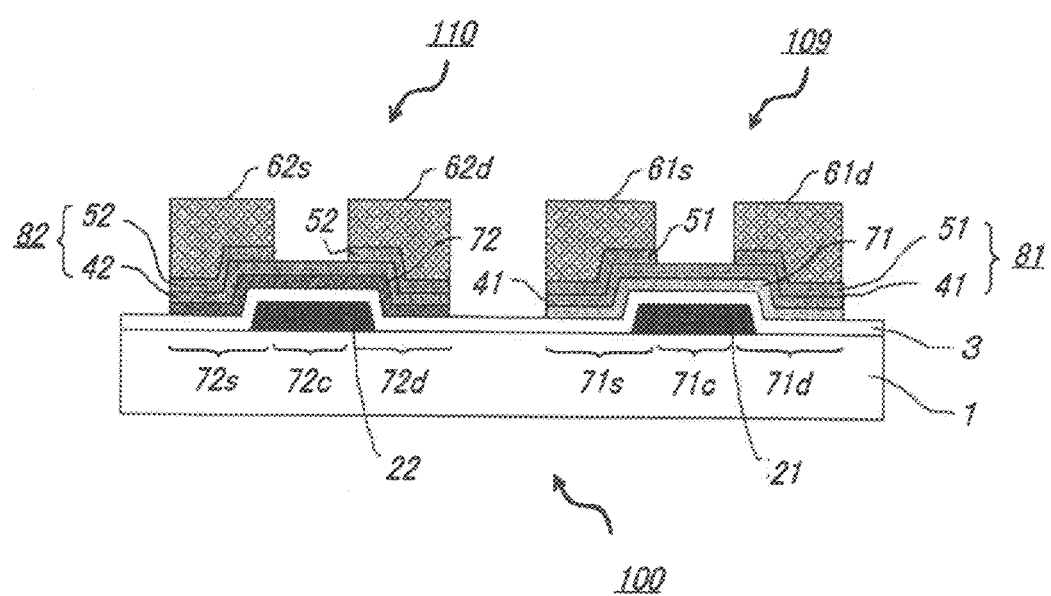
FIG. 2 is a sectional view showing a TFT which is used in the liquid crystal display according to the first embodiment of the invention.

Next, the configuration of the amorphous TFT and the microcrystalline silicon TFT respectively used for the pixel TFT 109 and the drive TFT 110 arranged on the array substrate 100 will be described with reference to FIG. 2. FIG. 2 is a sectional view showing the configuration of a TFT which is used in the liquid crystal display of the first embodiment. The TFT used in the liquid crystal display of the first embodiment is an inversely staggered type TFT.

On the transparent insulating substrate 1, gate electrodes 21 and 22 are respectively formed in a region where the pixel TFT 109 is to be formed and a region where the drive TFT 110 is to be formed. A gate insulating film 3 is formed so as to cover the gate electrodes 21 and 22. For the gate insulating film 3, a laminated film may be used in which a silicon nitride film (SiN film) and an oxide film ($SiO_x$ film) are sequentially laminated from the transparent insulating substrate 1 side. In a region where the pixel TFT 109 made of the amorphous TFT is to be formed, an amorphous silicon film 71 which becomes the active layer of the TFT is formed directly on the gate insulating film 3. In a region where the drive TFT 110 made of the microcrystalline silicon TFT is to be formed, a microcrystalline silicon film 72 which becomes the active layer of the TFT is formed directly on the gate insulating film 3. The microcrystalline silicon film 72 is formed by heating and melting the amorphous silicon film 7 through an excimer laser irradiation and converting amorphous silicon to crystalline silicon having a preferable crystal size equal to or smaller than about 100 nm.

An amorphous semiconductor layer 81 is formed on the amorphous silicon film 71 in the amorphous TFT. The amorphous semiconductor layer 81 is formed by laminating an amorphous silicon film 41 and two separate amorphous silicon films 51 including impurities. Similarly to the amorphous TFT used for the pixel TFT 109, an amorphous semiconductor layer 82 is formed on the microcrystalline silicon film 72 in the microcrystalline silicon TFT. The amorphous semiconductor layer 82 is formed by laminating an amorphous silicon film 42 and two separate amorphous silicon film 52 including impurities. In other words, both the amorphous silicon film 51 and the amorphous silicon film 52 including impurities form impurity regions including impurities in the amorphous semiconductor layer 81 and the amorphous semiconductor layer 82. The amorphous silicon film 71 and the amorphous semiconductor layer 81 are patterned to have the same shape. Similarly, the microcrystalline silicon film 72 and the amorphous semiconductor layer 82 are patterned to have the same shape. In the respective TFTs, a source region 71s (or 72s) and a drain region 71d (or 72d) are formed to generally correspond to the planar regions where the impurity regions made of the two amorphous silicon films 51 (or 52) exist. A channel region 71c (or 71c) is formed in a region sandwiched between the source region 71s (or 72s) and the drain region 71d (or 72d).

In the first embodiment, the impurity regions, which are formed in the amorphous semiconductor layer 81 and the amorphous semiconductor layer 82 common to the amorphous TFT and the microcrystalline silicon TFT, are formed by patterning the amorphous silicon films 51 (or 52) including impurities. Alternatively, impurities may be implanted partially into the amorphous semiconductor layer 81 and the amorphous semiconductor layer 82 to form the two separate impurity regions. In such a case, the source region 71s (or 72s), the drain region 71d (or 72d), and the channel region 71c (or 71c) are formed in the TFT to correspond to the impurity regions.

A source electrode 61s (or 62s) and a drain electrode 61d (or 62d) are respectively formed on amorphous silicon film 51 (or 52) including impurities in the source region 71s (or 72s) and the drain region 71d (or 72d). The amorphous silicon film 51 (or 52) including impurities is formed in contact with the source electrode 61s (or 62s) and the drain electrode 61d (or 62d) below the source electrode 61s (or 62s) and the drain electrode 61d (or 62d), and is separated in a region other than below the source electrode 61s (or 62s) and the drain electrode 61d (or 62d). As a result, the source electrode 61s (or 62s) and the drain electrode 61d (or 62d) are connected to the amorphous silicon film 41 (or 42) and the amorphous silicon film 71 (or the microcrystalline silicon film 72) through the amorphous silicon film 51 (or 52) including impurities. The amorphous silicon film 51 (or 52) including impurities reduces contact resistance with respect to the source electrode 61s (or 62s) and the drain electrode 61d (or 62d). In the channel region 71c (or 72c), the thickness of the amorphous silicon film 41 (or 42) is equal to or smaller than the thickness of the source region 71s (or 72s) and the drain region 71d (or 72d). As described above, the amorphous TFT and the microcrystalline silicon TFT have the same configuration in sectional view of FIG. 2. That is, the amorphous TFT and the microcrystalline silicon TFT have the same configuration, except that the amorphous silicon film 71 and the amorphous semiconductor layer 81 are different.

The description has been described for a case where the source region 71s (or 72s) and the drain region 71d (or 72d) of the TFT generally correspond to the planar regions where the impurity regions made of the two amorphous silicon films 51 (or 52) exist. In detail, the source region 71s (or 72s) and the drain region 71d (or 72d) are formed in the planar overlapping regions of the source electrode 61s (or 62s) and the drain electrode 61d (or 62d) and the two amorphous silicon films 51 (or 52). Like the first embodiment, when the impurity regions are formed below at least the source electrode and the drain electrode, it may be supposed that the source region and the drain region are formed below the source electrode and the drain electrode to correspond to the source electrode and the drain electrode.

Figure 5:
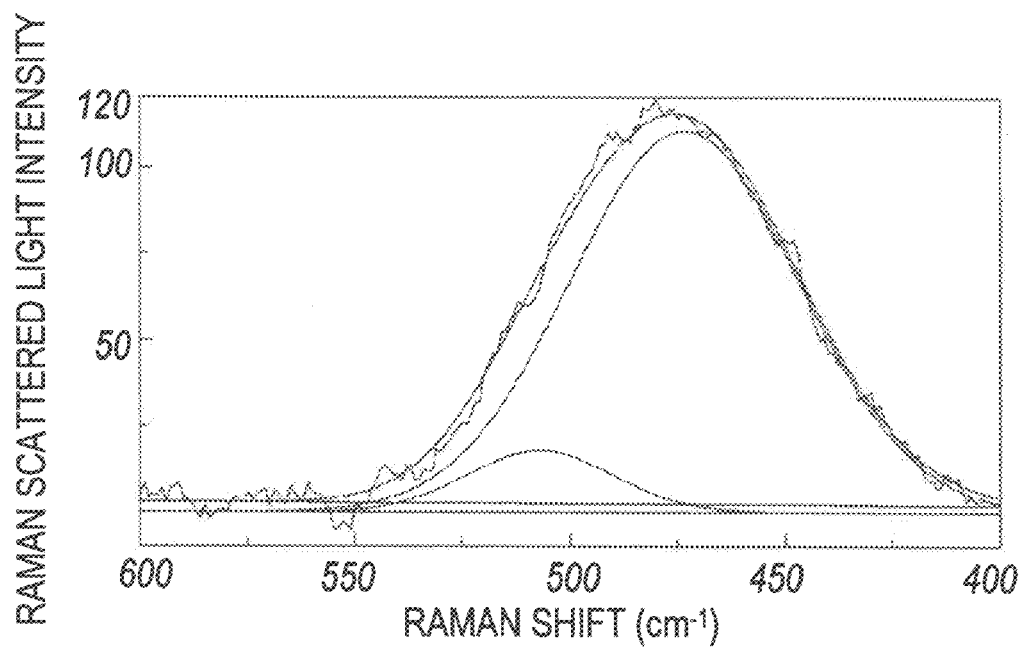
FIG. 5 shows analysis data when crystallinity of a semiconductor film after laser annealing in manufacturing a TFT is evaluated through Raman analysis according to the first embodiment of the invention.

In the array substrate 100, the inversely staggered type amorphous TFT and microcrystalline silicon TFT respectively having the amorphous silicon film 71 and the microcrystalline silicon film 72 are formed and mixed as the pixel TFT 109 and the drive TFT 110 forming the scan signal drive circuit 103 and/or the display signal drive circuit 104. Specifically, in the liquid crystal display of the first embodiment, as shown in FIG. 5, there is partially a portion where the amorphous TFT and the microcrystalline silicon TFT are arranged to be close to each other. As described in the description regarding the configuration of the array substrate 100, in the closely arranged portion, the amorphous TFT and the microcrystalline silicon TFT are arranged to be close to each other within a distance that goes beyond the positional accuracy of the laser irradiation.

Though not shown in FIG. 2 as being not included in the main part of the invention, in the pixel TFT 109 and the drive TFT 110, a passivation film is formed so as to cover the entire surface including the source electrode 61s (or 62s) and the drain electrode 61d (or 62d). In the pixel TFT 109, an opening is formed in a portion of the passivation film on the drain electrode 61d (or 62d), and the pixel electrode formed on the passivation film is connected to the drain electrode 61d (or 62d) through the opening. In this way, the pixel 105 described with reference to FIG. 2 is configured.

The operations of the amorphous TFT and the microcrystalline silicon TFT respectively used for the pixel TFT 109 and the drive TFT 110 which have been described above in terms of the configuration will be simply described. If a gate voltage is applied to the gate electrodes 21, 22 of the pixel TFT 109 and the drive TFT 110, in the amorphous silicon film 71 and the microcrystalline silicon film 72 serving as the active layers, channels are formed mainly in the channel region 71*c* and the channel region 72*c* facing the gate insulating film 3. When a voltage is applied between the source electrode 61*s* (or 62*s*) and the drain electrode 61*d* (or 62*d*), a current flows between the source region 71*s* (or 72*s*) and the drain region 71*d* (or 72*d*).

Next, a manufacturing method of the liquid crystal display of the first embodiment will be described. First, a manufacturing method of the amorphous TFT and the microcrystalline silicon TFT as the main part of the invention will be described with reference to FIGS. 3A to 3F. FIGS. 3A to 3F are sectional views showing a method of manufacturing a TFT according to the first embodiment.

Figure 3A:
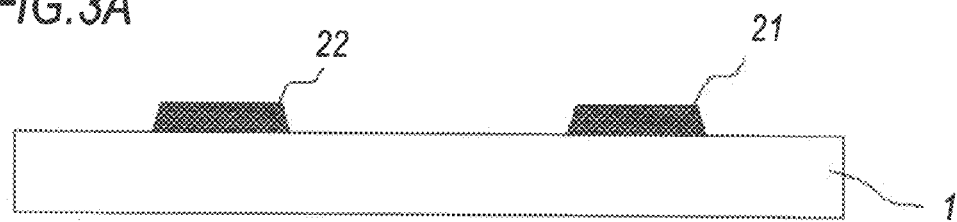
FIGS. 3A to 3F are sectional views illustrating a method of manufacturing a TFT which is used in the liquid crystal display according to the first embodiment of the invention.

First, a metal film is formed on the transparent insulating substrate 1 by a sputtering method. As the transparent insulating substrate 1, for example, a glass substrate may be used. For the metal film, aluminum (Al) or an alloy thereof may be used, and preferably, high-melting-point metal, such as molybdenum (Mo) or chromium (Cr), may be used. If high-melting-point metal is used for the metal film, damage to the metal film due to thermal damage during the subsequent excimer laser irradiation can be considerably suppressed. Photoresist which is photosensitive resin is coated on the metal film by spin coating, and a first photolithography process (photoengraving process) is performed to expose and develop the coated resist. Thus, the photoresist is patterned in a desired shape. Thereafter, the metal film is etched with the photoresist as a mask and is patterned in a desired shape. Thereafter, the photoresist pattern is removed. Thus, the patterns of the gate electrodes 21, 22 are formed. The end surfaces of the gate electrodes 21, 22 are preferably tapered. The tapered shape allows improvement coatability at the time of subsequent film formation. For example, when subsequent film formation is carried out to form the gate insulating film 3, improvement in dielectric strength voltage is achieved. Through the above-described process, the configuration shown in FIG. 3A is obtained.

Figure 3B:
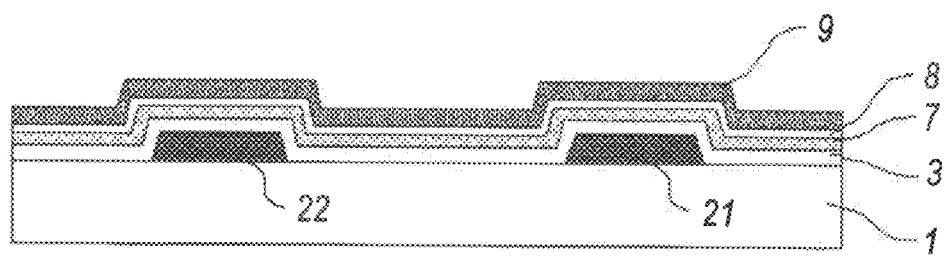

Next, the gate insulating film 3, the amorphous silicon film 7 as an amorphous semiconductor film, and a light-transmissive insulating film 8 are sequentially and continuously formed on the transparent insulating substrate 1 including the gate electrodes 21, 22 by a plasma CVD method. The gate insulating film 3 is a laminated film which is formed by sequentially laminating a silicon nitride film (SiN film) and an oxide film ($SiO_x$ film) from the insulating substrate 1 side. Although other insulating film configuration may be used, if the $SiO_x$ film is formed at least on the side of the gate insulating film 3 in contact with the amorphous silicon film 7, the $SiO_x$ film and the amorphous silicon film 7 can come into contact with each other. Thus, crystalline silicon which is formed later through the excimer laser irradiation, that is, the microcrystalline silicon film 72 has better crystallinity. Specifically, crystallinity in the vicinity of the interface with the $SiO_x$ film of the gate insulating film 3 becomes better. The light-transmissive insulating film 8 is made of an $SiO_x$ film. Next, high-melting-point metal, for example, Mo, is deposited at about 100 nm by a sputtering method to form a metal film 9. Through the above-described process, the configuration shown in FIG. 3B is obtained.

Figure 3C:
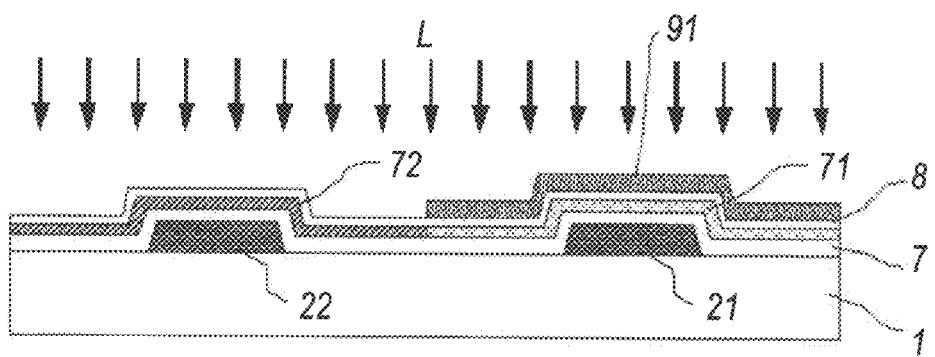

Next, a second photolithography process is performed to form a photoresist pattern other than the region where the microcrystalline silicon TFT is to be formed later. Then, the metal film 9 is etched with the photoresist pattern to form a metal film 91 by patterning. In other words, an opening is formed in the metal film 9 in the region where the microcrystalline silicon TFT is to be formed. The photoresist pattern for forming the opening in the metal film 9 can be formed with the accuracy of the photolithography process, thus the photoresist pattern can be formed with the positional accuracy of approximately 0.8 μm. The accuracy of the finished shape in the etching process of the metal film 9 can be controlled to be equal to or smaller than 100 nm (0.1 μm) thickness of the metal film 9. Thus, the accuracy of the opening of the metal film 9 can be formed with the positional accuracy of approximately 0.8 μm with no large difference from the accuracy of the photolithography process. In forming the metal film 91 by patterning, the light-transmissive insulating film 8 functions as a protective insulating film which protects the surface of the amorphous silicon film 7 from etching or contamination. Then, for the metal film 91 and the light-transmissive insulating film 8 made of an $SiO_x$ film in the region corresponding to the opening of the metal film 9 on the transparent insulating substrate 1, a laser annealing process is performed in which the laser irradiation is carried out while a scanning laser light L shaped as line beams with an extended horizontal width over the entire transparent insulating substrate 1. As a result, in the region corresponding to the metal film 91, the metal film 91 becomes a light shielding film, and since laser light L is not absorbed into the underlying amorphous silicon film 7, the amorphous silicon film 7 becomes the amorphous silicon film 71. Meanwhile, in the region corresponding to the opening of the metal film 9, that is, in the microcrystalline silicon TFT region, the laser light L transmits the light-transmissive insulating film 8 made of an $SiO_x$ film, that is, is absorbed into the amorphous silicon film 7 through the light-transmissive insulating film 8. As a result, the amorphous silicon film 7 is heated and molten, and is converted to the microcrystalline silicon film 72. As described above, only in the region corresponding to the opening of the metal film 9, the conversion to the microcrystalline silicon film 72 can be selectively made, and the region where the microcrystalline silicon film 72 is to be formed can be formed while being controlled with the same positional accuracy as the patterning accuracy of the opening. Through the above-described process, the configuration shown in FIG. 3C is obtained.

Detailed description will be provided for conversion from the amorphous silicon film 7 to the microcrystalline silicon film 72 by the laser light. First, the thicknesses of the SiN film and the $SiO_x$ film of the gate insulating film 3 are, for example, respectively 300 nm and 60 nm. Specifically, if the $SiO_x$ film has a large thickness, the laser light absorbed into the amorphous silicon film 7 is converted to heat, and heat is accumulated in the $SiO_x$ film. That is, the amorphous silicon film 7 serves as a buffer film and can suppress the irradiation energy density of laser light L necessary for conversion to the microcrystalline silicon film 72.

With regard to the amorphous silicon film 7, for the purpose of suppressing ablation, etc., of the amorphous silicon film 7 due to the excimer laser irradiation, dehydrogenation operation is performed to heat the amorphous silicon film 7 to higher than 300° C. and preferably to 400° C. before the excimer laser irradiation. The thickness of the amorphous silicon film is 50 nm, for example. If the amorphous silicon film is a smaller thickness, the irradiation energy density can be suppressed. If the thickness of the amorphous silicon film is excessively small, for example, about 10 nm, it is undesirable since silicon may be aggregated when being heated and molten.

Regarding the light-transmissive insulating film 8 formed on the amorphous silicon film 7, a light-transmissive inorganic insulating material can be comparatively freely selected insofar as the light-transmissive insulating film functions as a protective insulating film, which protects the surface of the amorphous silicon film 7 from etching or contamination in forming the metal film 91 by patterning, and which transmits laser light L of the excimer laser. In the first embodiment, for example, the light-transmissive insulating film 8 is made of an $SiO_x$ film to have a thickness of 20 nm. The laser light L of the excimer laser basically has high reflectance (about 60%) at the surface of the amorphous silicon film 7. However, if the $SiO_x$ film is formed on the surface of the amorphous silicon film 7, reflectance thereof is suppressed, and absorption into the amorphous silicon film 7 is increased. That is, the light-transmissive insulating film 8 of the first embodiment plays a role in improving absorption efficiency of laser light L absorbed into the amorphous silicon film 7. Further, the irradiation energy density necessary for conversion to the microcrystalline silicon film 72 varies in accordance with the thickness of the light-transmissive insulating film 8. That is, multireflection occurs within the light-transmissive insulating film 8. In addition, since the light-transmissive insulating film 8 is removed later, in the viewpoint of reduction of the etching time and productivity, it is advantageous that the thickness is comparatively small. Thus, it is preferable that the light-transmissive insulating film 8 is made of an $SiO_x$ film and also has a thickness of about 20 nm.

Figure 4:
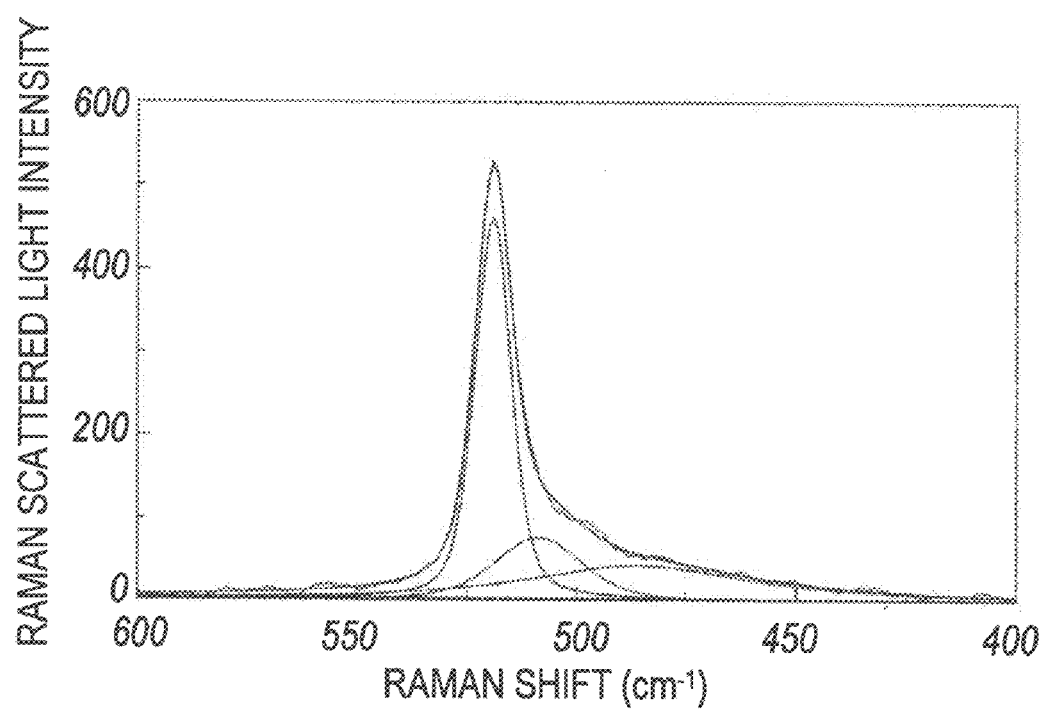
FIG. 4 shows analysis data when crystallinity of a semiconductor film after laser annealing in manufacturing a TFT is evaluated through Raman analysis according to the first embodiment of the invention.

The appropriate range of the irradiation energy density of the laser light L will be examined with reference to FIGS. 4 and 5 which show evaluation data through Raman analysis for use in evaluating crystallinity of a semiconductor film. FIG. 4 shows Raman analysis data for the amorphous silicon film 7 after a region exposed by the opening of the metal film 91 is irradiated the laser light L. FIG. 5 shows Raman analysis data for the amorphous silicon film 7 after a region where the metal film 91 serves as a light shielding film is irradiated with the laser light L and the laser light L is not absorbed. As indicated by Raman analysis data of FIG. 4 in the opening of the metal film 91, according to this configuration, the crystallization rate 86.2% is obtained from the Raman scattered light intensity peak around the Raman shift 520 $cm^{-1}$ with the irradiation energy density equal to or greater than 140 $mJ/cm^2$. More preferably, the crystallization rate is about 90% with 150 to 170 $mJ/cm^2$. Through SEM observation or AFM observation of the crystal size after Secco etching, microcrystalline silicon is confirmed, and it is confirmed that the amorphous silicon film 7 is converted to the microcrystalline silicon film 72. Incidentally, when no light-transmissive insulating film 8 is provided on the amorphous silicon film 7, the irradiation energy density is 270 $mJ/cm^2$. As described above, since the irradiation energy density of laser light L varies in accordance with the configuration of the amorphous silicon film 7 or the light-transmissive insulating film 8, it is necessary to adjust the irradiation energy density so as to obtain an appropriate crystallization rate. Specifically, for the use in the drive TFT 110 forming the scan signal drive circuit 103 and/or the display signal drive circuit 104, it is necessary to adjust the irradiation energy density to be higher than at least the condition under which a microcrystalline semiconductor film, in which crystallization rate of microcrystal having a crystal grain size equal to or smaller than 100 nm is equal to or greater than 60% in the crystalline semiconductor film, is obtained.

Meanwhile, as indicated by Raman analysis data of FIG. 5 in the light shielding portion of the metal film 91, where the metal film 91 serves as a light shielding film and laser light L is not absorbed into the underlying amorphous silicon film 7, with regard to the amorphous silicon film 7, only a peak in the energy density the same as described above around the Raman shift 480 $cm^{-1}$ appears, and the foregoing peak around 520 $cm^{-1}$ does not appear. That is, it is confirmed to be amorphous silicon, that is, it is confirmed that the amorphous silicon film 7 is maintained in the amorphous silicon state, and is the amorphous silicon film 71. Meanwhile, if the irradiation energy density is about 300 $mJ/cm^2$, the metal film 91 serves as a photo-thermal conversion film, and the underlying amorphous silicon film 7 is crystallized. That is, the metal film 91 having an opening substantially does not function as a mask to selectively convert the amorphous silicon film 7 to the microcrystalline silicon film 72, which is a crystalline semiconductor, only in the region exposed by the opening. The range in which the amorphous silicon film 7 can be maintained in the amorphous silicon state directly below the metal film 91 is equal to or smaller than 250 $mJ/cm^2$. Resistance of the metal film 91 or the gate electrode 2 against the Al material is equal to or smaller than 330 $mJ/cm^2$. As described above, since the irradiation energy density of laser light L such that the amorphous silicon film 7 can be maintained in the amorphous silicon state directly below the metal film 91 varies in accordance with the configuration of the metal film 91 or the light-transmissive insulating film 8, it is necessary to adjust the irradiation energy density. Specifically, in order to cause the metal film 91 to function as a mask and to divide the region of the amorphous silicon film 71 and the region where the microcrystalline silicon film 72 is to be formed, it is necessary to adjust the irradiation energy density to be lower than at least the condition under which the amorphous semiconductor film arranged below the metal film and shielded from the laser light is converted to the crystalline semiconductor film by heated through propagation of heat generated by absorption of the laser light into the metal film.

As described above, with regard to the irradiation energy density of laser light L, an upper limit value and a lower limit value have to be appropriately optimized in accordance with the configuration at the time of irradiation. At the same time, as described above, the upper limit value and the lower limit value can be easily set by combination both Raman evaluation of crystallinity of the obtained microcrystalline silicon film 72 and Raman evaluation of the amorphous silicon film 71 in the region arranged below the metal film 91 (confirmation that crystallization is not made and the amorphous silicon state is maintained).

With an increase in size of the substrate in these days, line beams of the excimer laser are increased in size and practically expanded to 400 mm in the longitudinal direction. However, the transparent insulating substrate is generally of a size larger than the current maximum level of the line beams. Accordingly, when laser irradiation operation is performed over the entire surface of the substrate, the transparent insulating substrate has to be relatively moved with respect to the line beams. Further, laser scan has to be carried out in the longitudinal direction with piecing, and the laser scan regions have to be pieced together. At this time, it is difficult to control the optimum irradiation energy density or optimum beam quality at the pieced portion. Further, since the laser irradiation state is slightly changed in the start portion or end portion of laser scan, the controlling is similarly difficult. Thus, when the entire surface of the substrate is irradiate with the laser, there is a region where the laser irradiation state cannot be inevitably controlled in some parts. For this reason, even when irradiation operation is performed for amorphous silicon over the entire surface under a predetermined condition that the irradiation energy density is optimized as described above, in a region where the irradiation state cannot be controlled, microcrystalline silicon having a desired grain size may not be formed or the amorphous state may be maintained. In the first embodiment, laser irradiation is carried out such that the region where the laser irradiation state cannot be controlled is above the metal film 91. That is, laser irradiation is carried out such that the region exposed by the opening of the metal film 91 is the central portion of the laser scan region away from the start portion or the end portion of laser scan or the pieced portion. With the above-described control, in the region exposed by the opening of the metal film 91, the microcrystalline silicon film 72 having a desired grain size can be reliably obtained in the region where the microcrystalline silicon film 72 is to be formed, and in the region located below the metal film 91, the amorphous silicon film 71 can still remain reliably.

Figure 3D:
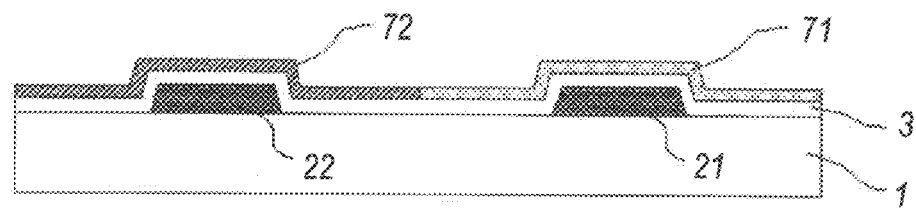

After the laser annealing process is performed as described above, subsequently, the remaining metal film 91 is removed, and the light-transmissive insulating film 8 is removed. The light-transmissive insulating film 8 can be removed by operation for two minutes or more with hydrofluoric acid (specifically, rare hydrofluoric acid or buffered hydrofluoric acid at a concentration of several % is used) as an etchant. Through the above-described process, the configuration shown in FIG. 3D is obtained.

Figure 3E:
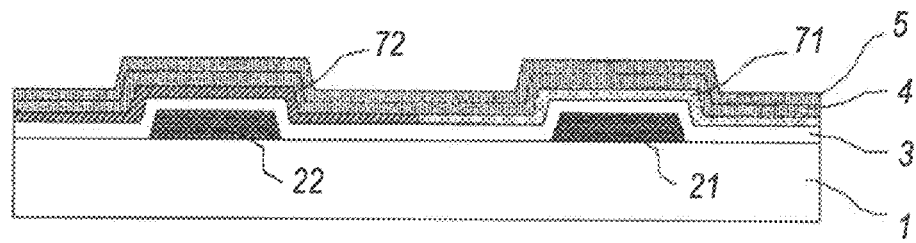
Figure 3F:
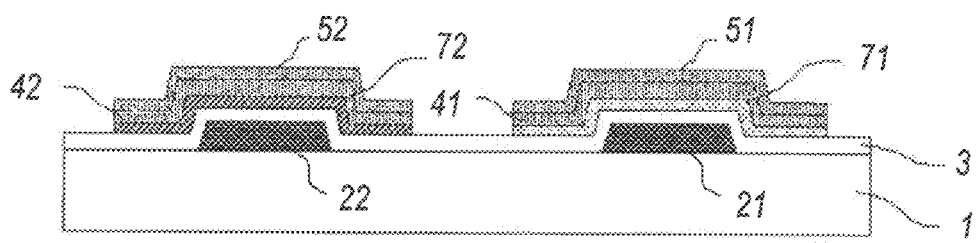

Next, an amorphous silicon film 4 and an amorphous silicon film 5 including impurities are continuously formed on the amorphous silicon film 71 and the microcrystalline silicon film 72. Through the above-described process, the configuration of FIG. 3E is obtained. Subsequently, the amorphous silicon film 5 including impurities, the amorphous silicon film 4, and the laminated film of the amorphous silicon film 71 and the microcrystalline silicon film 72 are sequentially patterned by a third photolithography process and an etching process. Thus, the amorphous silicon film 71, the amorphous silicon film 41, and the amorphous silicon film 51 including impurities are formed of a desired shape, and the microcrystalline silicon film 72, the amorphous silicon film 42, and the amorphous silicon film 52 including impurities are simultaneously formed of a desired shape, and the respective TFTs is separated. Through the above-described process, the configuration shown in FIG. 3F is obtained.

Next, a metal film is formed by a sputtering method. Then, the metal film is patterned in a desired shape by a fourth photolithography process and an etching process, such that the source electrode 61s (62s) and the drain electrode 61d (62d) are formed. Then, the entire amorphous silicon films 51 and 52 including impurities in the thickness direction and a portion of the amorphous silicon films 41 and 42 in the thickness direction between the source electrode 61s (62s) and the drain electrode 61d (62d) are removed by etching with the source electrode 61s (62s) and the drain electrode 61d (62d) used as a mask. As a result, the amorphous semiconductor layer 81 (or 82), in which the amorphous silicon film 41 (or 42) and the two separate amorphous silicon films 51 (or 52) including impurities are laminated, is formed on the amorphous silicon film 71 (or the microcrystalline silicon film 72). Through the above-described process, the configuration shown in FIG. 2 is obtained.

As described above, the inversely staggered type amorphous TFT and the inversely staggered type microcrystalline silicon TFT can be formed which respectively have the amorphous silicon film 71 and the microcrystalline silicon film 72 as the active layers. Further, the amorphous silicon film 71 and the microcrystalline silicon film 72 can be selectively formed with the same positional accuracy as the patterning positional accuracy at the time of formation of the opening of the metal film 9. Thus, the amorphous TFT and the microcrystalline silicon TFT can be formed to be close to each other with the same positional accuracy as the patterning positional accuracy. In addition, since the patterning positional accuracy is higher than the positional accuracy of the laser irradiation, in other words, the amorphous TFT and the microcrystalline silicon TFT can be arranged to be close to each other within a distance that goes beyond the positional accuracy of the laser irradiation. As a result, as shown in FIG. 2, the pixel TFTs 109 in the display section 101 and the drive TFTs 110 including the scan signal drive circuit 103 and/or the display signal drive circuit 104 can be arranged to be close to each other or can be mixedly formed on the transparent insulating substrate 1.

In addition, through not shown in FIGS. 3A to 3F, in completing the array substrate 100, after the source electrode 61s (or 62s) and the drain electrode 61d (or 62d) are formed, the passivation film is formed so as to cover the entire region. In the pixel TFT 109, an opening is formed in a portion of the passivation film on the drain electrode 61d (or 62d) by a fifth photolithography process and an etching process, and a pixel electrode is formed on the passivation film by a sixth photolithography process and an etching process. Further, configuration other than the pixel TFTs 109 and the drive TFTs 110, for example, the gate lines 113, the storage capacitor lines 115, the source lines 114, the storage capacitors 112, the external terminals, and the like, in the display section are formed simultaneously by the first to sixth photolithography processes and the etching processes described above. In this way, the array substrate 100 described with reference to FIG. 1 is formed.

Figure 6:
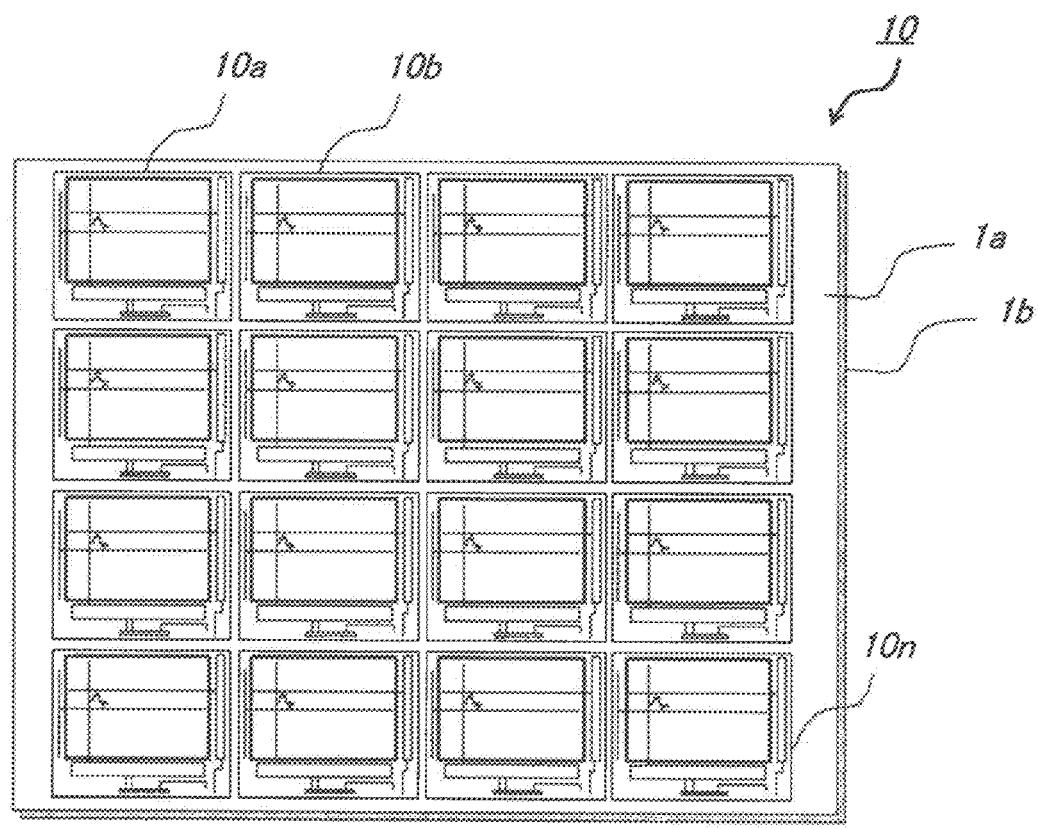
FIG. 6 is a plan view showing a mother liquid crystal cell substrate in a manufacturing process of the liquid crystal display according to the first embodiment of the invention.

Subsequently, a cell assembling step in the manufacturing method of the liquid crystal display will be described with reference to FIG. 6. FIG. 6 is a schematic plan view showing the configuration of a mother liquid crystal cell substrate 10 in which multiple liquid crystal cell substrates forming the liquid crystal display panels are arranged in an array in the manufacturing process of the liquid crystal display according to the first embodiment. Usually, in manufacturing a small liquid crystal display, from the viewpoint of mass production efficiency, as shown in FIG. 6, the mother liquid crystal cell substrate 10 in which a plurality of liquid crystal cell substrates 10a, 10b, . . . , and 10n are partitioned and arranged in an array is formed, and the liquid crystal cell substrates 10a, 10b, . . . , and 10n are cut from the mother liquid crystal cell substrate 10 to be of a size conforming to an individual liquid crystal display panel, such that liquid crystal panel shown in FIG. 1 is obtained. Therefore, in the manufacturing method of the array substrate 100 described above, a plurality of array substrates 100 can be manufactured simultaneously as a single mother array substrate 1a which is a large transparent insulating substrate, in which a plurality of array substrates 100 are partitioned and arranged in an array.

As shown in FIG. 6, the mother array substrate 1a, which is manufactured simultaneously by the manufacturing method of the array substrate 100, and a mother counter substrate 1b, which face the mother array substrate 1a, is prepared. As the mother counter substrate 1b, a general counter substrate having color resist (color material), black matrix (BM), the counter electrode, etc., may be used. Alignment films are respectively formed by a general method on the surfaces of the mother array substrate 1a and the mother counter substrate 1b prepared as described above. Then, a seal pattern is formed on one substrate to surround liquid crystal filling regions corresponding to the liquid crystal cell substrates 10a, 10b, . . . , and 10n, and the mother array substrate 1a and the mother counter substrate 1b are bonded to each other. In this way, the mother liquid crystal cell substrate 10 shown in FIG. 6 is formed. Filling of liquid crystal into the seal pattern may be carried out by a vacuum filling method in which liquid crystal is filled from a filling port after bonding, or by a liquid crystal drop method in which liquid crystal drops in the seal pattern, and liquid crystal filling and bonding are carried out simultaneously. In the case of the vacuum filling method, a liquid crystal cell substrate cutting process, in which the liquid crystal cell substrates are cut of a size conforming to an individual liquid crystal display panel, is performed before filling of liquid crystal. In the liquid crystal drop method, the liquid crystal cell substrate cutting process is performed after filling of liquid crystal. In this way, the cell assembling process is completed, and the individual liquid crystal cell substrates 10a, 10b, . . . , and 10n are obtained.

Finally, the polarizing plates are attached to the external sides of the array substrate 100 and the counter substrate in each of the liquid crystal cell substrates 10a, 10b, . . . , and 10n. With regard to the external terminals in the array substrate 100, when the counter substrate is cut such that counter substrate is removed and exposed, the IC chip 118 or the printed board 119 is mounted on the exposed external terminals. In this way, the liquid crystal display panel shown in FIG. 1 is completed. In addition, the backlight unit is provided on the rear side of the array substrate 100, that is, the opposite side to the viewing side of the liquid crystal display panel, through an optical film, such as a retardation film, and the liquid crystal display panel and the peripheral members are appropriately accommodated in the frame made of resin or metal. Thus, the liquid crystal display device of the first embodiment is completed.

Figure 7:
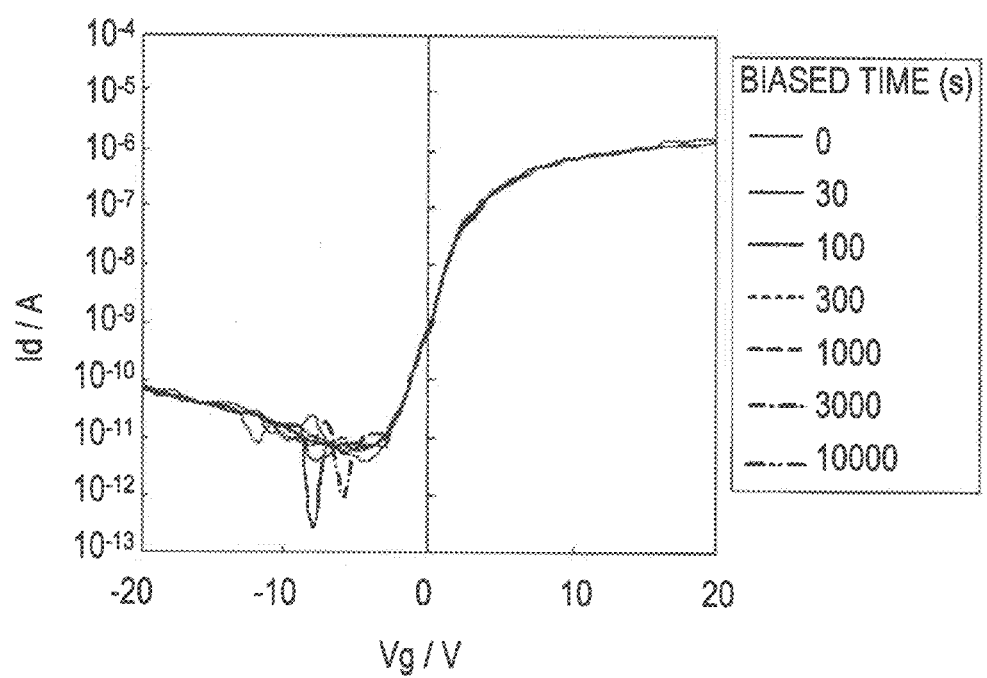
FIG. 7 shows an I-V (current-voltage) characteristic at the time of a longtime bias application test for a microcrystalline silicon TFT according to the first embodiment of the invention.
Figure 8:
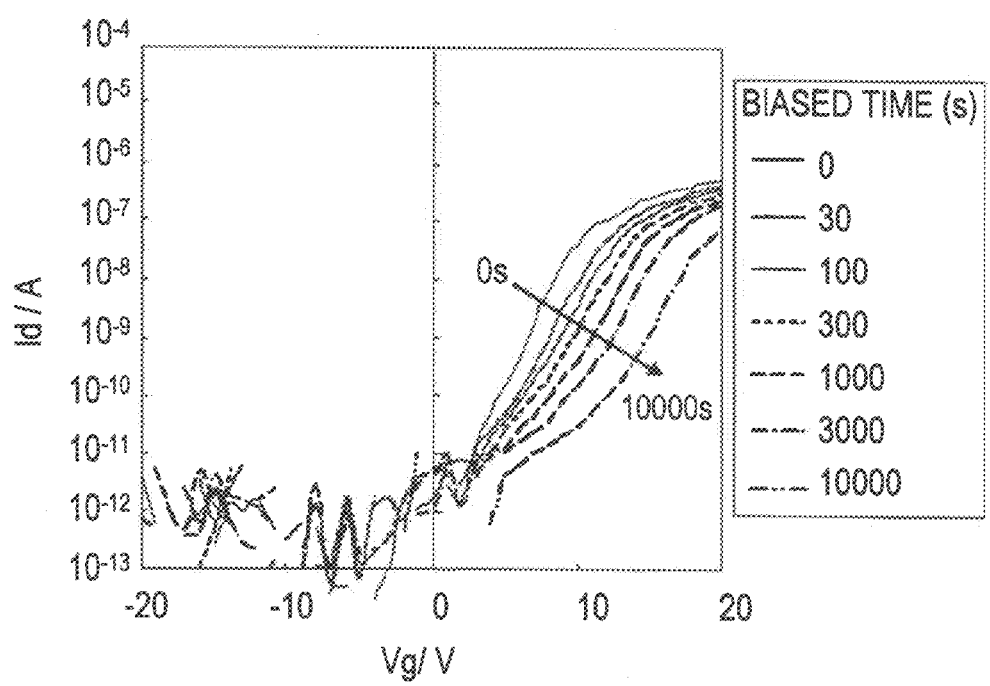
FIG. 8 shows an I-V (current-voltage) characteristic at the time of a longtime bias application test for an amorphous TFT according to the first embodiment of the invention.

Subsequently, the evaluation result of the electrical characteristics of the amorphous TFT and the microcrystalline silicon TFT, which are manufactured by the manufacturing method of the liquid crystal display of the first embodiment, respectively including the amorphous silicon film 71 and the microcrystalline silicon film 72 as the active layers will be described. First, the basic TFT characteristics will be described. In the case of the microcrystalline silicon TFT, the electric field effect mobility ($\mu$), off-current (Ioff), and sub-threshold coefficient (S value) in the saturation region are respectively 4.3 cm$^2$/V·s, 17.5 pA, and 1320 mV/dec. In the case of the amorphous TFT, these values are respectively 0.4 cm$^2$/V·s, 3.58 pA, and 1060 mV/dec. FIGS. 7 and 8 show changes in TFT characteristics at the time of a longtime bias application test (BTS: Bias Temperature Stress) as the result of evaluation regarding reliability of the TFT characteristics. In the graphs, the horizontal axis represents a drain current Id, and the vertical axis represents a gate voltage Vg. The graphs show the Id-Vg characteristics at each application time while the bias application time changes from 0 second to 10000 seconds. FIG. 7 shows the result in the case of the microcrystalline silicon TFT. FIG. 8 shows the result in the case of the amorphous TFT. As a result, it can be seen that, while in the case of the amorphous TFT, as shown in FIG. 8, the characteristics are shifted toward positive as time passes, in the case of the microcrystalline silicon TFT, as shown in FIG. 7, the characteristics are scarcely changed.

Figure 9:
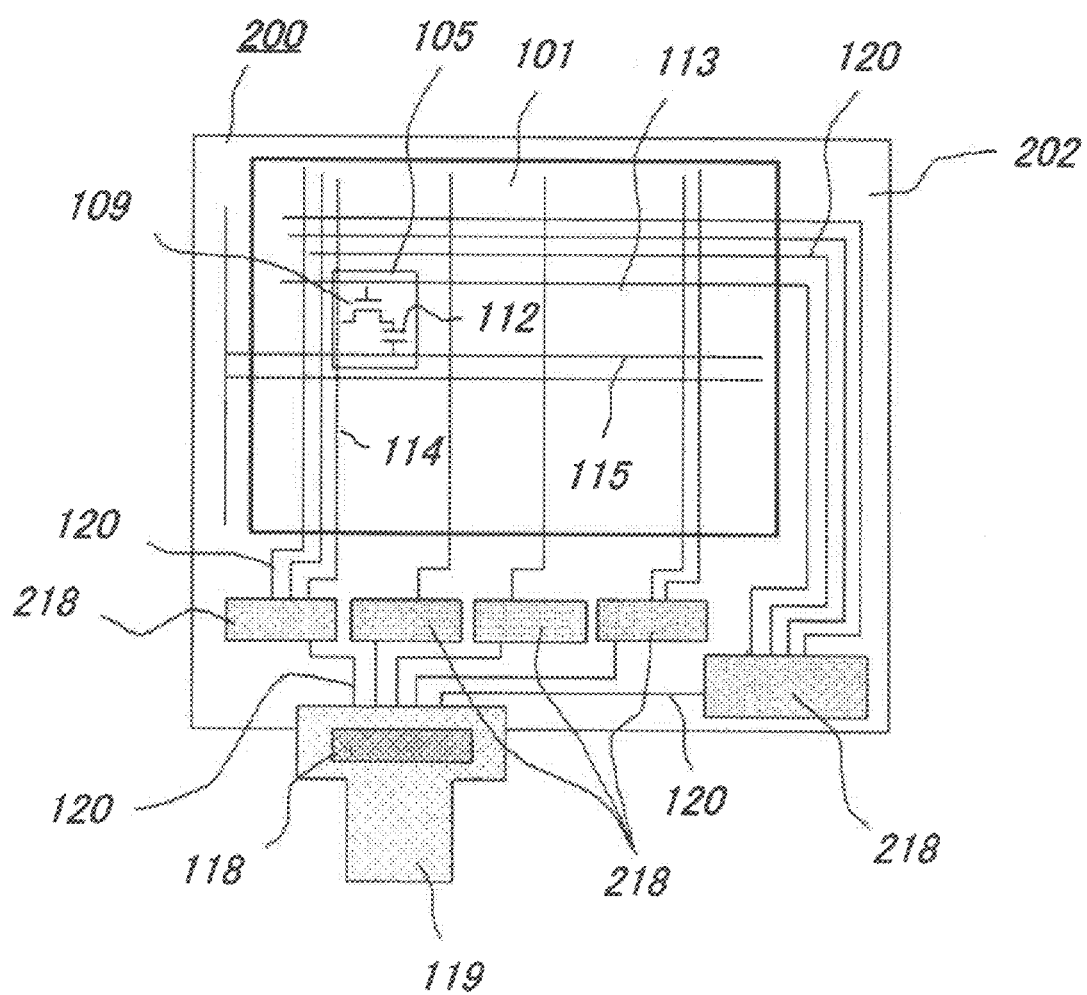
FIG. 9 is a plan view showing a liquid crystal display using a general amorphous TFT in the related art.

Subsequently, the effect of the liquid crystal display of the first embodiment will be described while appropriately comparing a liquid crystal display of the related art. FIG. 9 shows a liquid crystal display using a general amorphous TFT of the related art. As described with reference to FIG. 8, in the case of the amorphous TFT, in general, if a continuous operation is carried out for a long time, a threshold voltage shift occurs, and a normal drive operation may not be carried out. The drive TFT 110 forming the drive circuit constantly carries out the TFT operation. That is, when the amorphous TFT is used as the drive TFT 110 in the drive circuit of the liquid crystal display such that the TFT operation has to be constantly carried out, a threshold voltage shift occurs and a normal drive operation may not be carried out. As a result, normal display operation may not be performed. Further, in order that a desired drive circuit operation is carried out as the drive TFT 110 in the drive circuit, there is demand for a certain level of drive capability of the TFT. Even when the amorphous TFT is used, it is possible to technically meet such a demand by increasing the size of the TFT, but the increase in the size of the TFT causes an enormous increase in the area of the drive circuit. Thus, like the liquid crystal display of the related art shown in FIG. 9, the amorphous TFT is used for the pixel TFT 109 for switching, however, usually, the use of the amorphous TFT is not selected for the drive circuit formed on the substrate, like the scan signal drive circuit 103 and/or the display signal drive circuit 104 of the first embodiment shown in FIG. 1. In a liquid crystal display using a general amorphous TFT of the related art, instead of the scan signal drive circuit 103 and/or the display signal drive circuit 104, several external IC chips 218 have to be added for operation of the drive circuit, and the number of IC chips 118 and 218 increases as a whole. According to the liquid crystal display of the first embodiment, the amorphous TFT suitable for the pixel TFT 109 formed on in pixel 105 can be provided, and the microcrystalline silicon TFT with small threshold voltage shift can also be provided for the drive TFT 110 forming the scan signal drive circuit 103 and/or the display signal drive circuit 104. Thus, the number of components of the IC chips 118, 218 can be reduced, and the comparatively large installation space of the IC chips 118, 218 can be saved. That is, reduction in the number of components, reduction in the weight of the liquid crystal display, and reduction in the dimension of the frame region of the liquid crystal display (reduction in size per necessary display region area) can be achieved. Further, since the mounting step of the IC chip 218 can be removed, improvement in productivity at the time of manufacturing considering prevention of occurrence of quality loss due to defective products can be achieved. In addition, the amorphous TFT and the microcrystalline silicon TFT can be formed simultaneously during the manufacturing process, so that productivity is not reduced. As a result, productivity is improved in the entire manufacturing, achieving reduction in cost.

As described above, according to the first embodiment, Both the metal film having the opening formed by patterning and the light-transmissive insulating film are irradiated with the laser to crystallize the amorphous semiconductor film, so that only one of the semiconductor layers arranged to be close to each other can be selectively crystallized with high accuracy. Further, the amorphous TFT and the microcrystalline silicon TFT are respectively manufactured by the amorphous semiconductor film and the microcrystalline semiconductor film in which the regions are selected and divided by using such a crystallization method. Thus, a special technique or control does not have to be provided. Further, a manufacturing equipment (manufacturing apparatus), which is generally owned a manufacturer of a liquid crystal display panel, can be used. That is, the amorphous TFT and the microcrystalline silicon TFT can be formed simultaneously on the same transparent insulating substrate without using a special manufacturing apparatus (a specially developed laser irradiation apparatus having high positioning accuracy, which is not provided in a general laser irradiation apparatus in manufacturing a liquid crystal display). In addition, the amorphous TFT and the microcrystalline silicon TFT can be arranged to be close to each other within a distance that goes beyond the positional accuracy of the laser irradiation (the term "separation" used herein indicates the range which satisfies to be below the current laser irradiation positional accuracy level by 1 mm or less and above the resist patterning accuracy level by 0.8 µm or more). Thus, the amorphous TFT can be used for the pixel TFT which is to be formed in the display section, and the microcrystalline silicon TFT can be used for the drive TFT forming the signal drive circuit. Simultaneously, the display section and the signal drive circuit can be arranged to be close to each other. As a result, the following advantages can be realized simultaneously: variations in the TFT characteristics of the pixel TFT or leak current can be easily reduced to suppress display unevenness; since the drive circuit is formed on the substrate, and some IC chips are replaced, the number of components can be reduced, the liquid crystal display can be reduced in weight, the frame region of the liquid crystal display can be reduced in dimension, and productivity at the time of manufacturing can be improved; and since the display section and the scan signal drive circuit or the display signal drive circuit are arranged to be close to each other, the frame region of the liquid crystal display can be reduced in dimension. In addition, the amorphous TFT and the microcrystalline silicon TFT can be formed simultaneously by the same manufacturing process without a separately manufacturing process, realizing the above-described advantages without reducing productivity.

In the first embodiment, a case has been described where the invention is applied to the use of the amorphous TFT and the microcrystalline silicon TFT, in which the regions are selected and divided, for the pixel TFT 109 in the general liquid crystal display and the drive TFT 110 forming the scan signal drive circuit 103 and/or the display signal drive circuit 104. However, the application range of the invention is not limited thereto. For example, in a liquid crystal display having an internal optical sensor unit, a drive TFT is used not only to drive the display signal, but also to drive an element or the like in the optical sensor unit. For such a drive TFT, the microcrystalline silicon TFT of the invention may be used for the drive TFT driving the optical sensor unit. Hereinafter, a modification case of the first embodiment will be described where the invention is applied to a liquid crystal display having an internal optical sensor unit.

Figure 10:
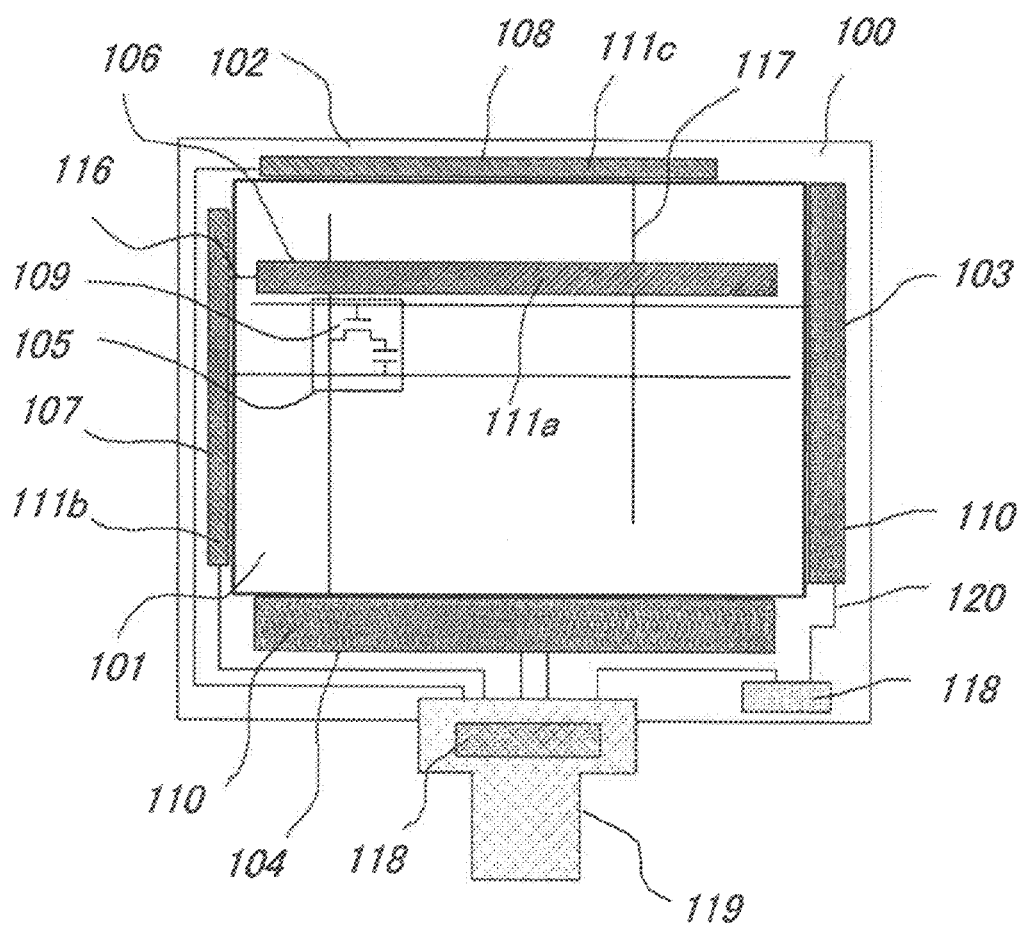
FIG. 10 is a plan view showing a liquid crystal display panel in a liquid crystal display with an internal optical sensor according to a modification of the first embodiment of the invention.

FIG. 10 is a schematic plan view showing the configuration of a liquid crystal display panel having an internal optical sensor unit according to the modification of the first embodiment. This modification is partially changed from the first embodiment in that the optical sensor unit is embedded. Hereinafter, description will be provided focusing on the modification from the first embodiment, and the same configuration as the first embodiment will be appropriately omitted. As shown in FIG. 10, in this modification, optical sensor units 106 are embedded in the display section 101 of the liquid crystal display panel. Each optical sensor unit 106 includes a light receiving element and a circuit which is formed by a drive TFT 111a for driving the light receiving element. Optical sensor control circuits 107, 108 are provided in the frame region 102, which is provided so as to surround the display section 101, to control the optical sensor unit and are connected to the optical sensor units 106 through row lines 116 and column lines 117. The optical sensor control circuits 107, 108, which drive the drive TFTs 111a of the optical sensor units 106, and which converts the quantity of light detected by the light receiving elements to a current or voltage, and which also operate the current or voltage as a signal, and are respectively formed by circuits including drive TFTs 111b, 111c.

With regard to the drive TFT 111a in the optical sensor unit 106 and the drive TFTs 111b, 111c forming the optical sensor control circuits 107, 108, similarly to the drive TFT 110 for driving the display signal, there is demand for comparatively high drive capability and operation reliability. Thus, it is preferable to select a polycrystalline silicon TFT or a microcrystalline silicon TFT having drive capability (that is, high electric field effect mobility) of the TFT. In this modification, the drive TFTs 111a, 111b, and 111c are formed of the same microcrystalline silicon TFT as for the drive TFT 110 simultaneously by using the crystallization method of the amorphous semiconductor film and the manufacturing method of the amorphous TFT and the microcrystalline silicon TFT which have been described in the first embodiment are used. Further, similarly to the first embodiment, the display section 101 and the scan signal drive circuit 103 and/or the display signal drive circuit 104, on which the drive TFT 110 made of the microcrystalline silicon TFT is arranged, are arranged to be close to each other. In addition, the display section 101 and the optical sensor control circuits 107, 108, on which the drive TFTs 111b and 111c are respectively arranged, are arranged to be close to each other at the same level. Furthermore, the drive TFT 111a in the optical sensor unit 106 is arranged in the display section 101 and is also arranged adjacent to the pixel TFT 109, which is arranged similarly in the display section 101, in the display section 101. Specifically, it is advantages that the drive TFT 111a can directly drive the light receiving element in each pixel, thus the drive TFT 111a is preferably provided to be adjacent to the pixel TFT 109 in the display region or to be mixed with the pixel TFT 109 in the display region. Furthermore, when the drive TFT 111a is provided in each pixel or mixed with the pixel TFT 109 in the display region, the drive TFT 111a is preferably arranged in a redundant region, such as below a light shielding portion or a reflecting electrode, which is not directly involved in display.

As described above, according to the modification of the first embodiment, in addition to the advantages described in the first embodiment, the microcrystalline silicon TFT can be used for the drive TFTs forming the optical sensor control circuits, and the display section and the signal drive circuit can be arranged to be close to each other. Thus, it is not necessary to arrange a new IC chip having a function for an optical sensor control circuit, and the optical sensor control circuit can be arranged to be close to the display section. Therefore, it is possible to prevent an increase in the size of the liquid crystal display or an increase in cost due to the optical sensor function being added. Further, the drive TFTs for driving the light receiving elements are provided in the pixel, or mixedly arranged in the display region. That is, the drive TFTs for driving the light receiving elements can be provided to be close to each other in the display region, such that effective drive can be realized while there is little signal transfer loss or disconnection in the line path. In addition, the drive circuit can be arranged in a redundant region, such as the light shielding portion or below the reflecting electrode in the display region, which is not directly involved in display. Therefore, the drive TFT forming the optical sensor control circuit can be arranged without causing an increase in the size of the entire liquid crystal display.

In the first embodiment and the modification, cases have been described for the liquid crystal display in which the drive TFTs 110, 111a, 111b, and 111c forming the scan signal drive circuit 103, the display signal drive circuit 104, and the optical sensor unit 106, and the optical sensor control circuit 107, and the optical sensor control circuit 108 are made of the microcrystalline silicon TFT, and are arranged mixed with the pixel TFT 109 made of the amorphous TFT. However, the scope of the invention is not limited thereto. For example, in the crystallization process of the amorphous semiconductor film, large crystal grains may be formed by controlling the irradiation conditions, such as the laser irradiation energy, the atmosphere at the time of irradiation, and the substrate temperature. That is, the semiconductor layer which is to be formed by the crystallization process is not limited to microcrystalline silicon, polycrystalline silicon may be used. The same advantages as in the first embodiment and the modification can be obtained insofar as a crystalline semiconductor film is formed. From the viewpoint of the wide range of appropriate conditions, ease of manufacturing, and little characteristic variation of the TFT using the resultant crystalline semiconductor film, a microcrystalline semiconductor film is preferable. With regard to the type of semiconductor, although silicon has been described as an example, needless to say, other semiconductors may be used insofar as the semiconductor can be converted from an amorphous semiconductor to a microcrystalline or crystalline semiconductor through the laser irradiation.

With regard to the purposes, the invention may be applied to an organic EL display, other display devices, and a semiconductor device of an imaging device or the like, in addition to the liquid crystal display. In this case, the same advantages can be obtained insofar as a display device or a semiconductor device is provided in which two types of TFTs respectively having an amorphous semiconductor film and a crystalline semiconductor film are arranged to be close to each other, as described in the first embodiment, the modification, and another modification as suggested above. In this case, a TFT having a crystalline semiconductor film may be used in a drive circuit which drives various elements or the like insofar as the TFT forming the drive circuit, and may be used for a TFT which constitutes a digital logical circuit. When the TFT is used in the any circuit, a high-speed operation can be achieved without causing an increase in the circuit area, it is not necessary to arrange a new IC chip, and the respective circuits can be arranged to be close to the display section. Further, it is possible to prevent an increase in the size of the display device or the semiconductor device or an increase in cost. Thus, the same advantages as in the first embodiment and the modification can be obtained.

In the liquid crystal display, the pixel TFT 109 made of an amorphous TFT functions as a switching element which drive liquid crystal and controls switching on and off of the supply of the display voltage for controlling the quantity of light to be viewed as an image. However, it should suffice that the pixel TFT 109 is a transistor which supplies electric charges, such as a display voltage or display current, for controlling the quantity of light to be viewed as an image in the display device. For example, in an organic EL display, a transistor which is provided in each pixel to supply a display current for controlling the quantity of light to be supplied to an organic luminous layer and viewed as an image may be defined as a pixel TFT and formed of an amorphous TFT. In any case, a display voltage or a display current which directly contributes to the quantity of light to be viewed as an image is supplied by an amorphous TFT. Therefore, variations in the TFT characteristics can be easily reduced, and display unevenness can be suppressed.

Second Embodiment

In the first embodiment and the modification, a desired region where a drive circuit is arranged or a desired region as a unit of TFT, which is heated and molten through the laser irradiation to form crystalline silicon, has been described. The invention is not limited to such embodiments, and microcrystalline silicon may be formed in a region of a single TFT, for example, only in a partial region of a single semiconductor layer. Thus, a TFT can be realized in which both amorphous silicon and microcrystalline silicon are mixed in the single semiconductor layer. In a second embodiment, description will be provided for an example where the invention is applied to a single TFT in the same manner as described above.

Figure 11:
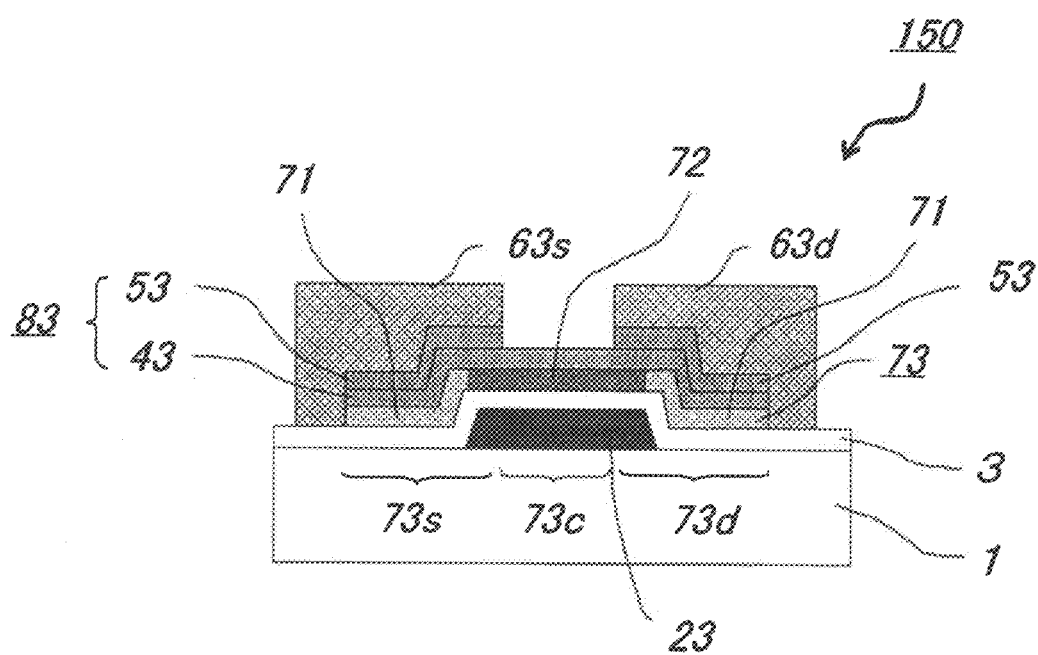
FIG. 11 is a sectional view showing a TFT according to a second embodiment of the invention.

FIG. 11 is a sectional view showing the configuration of a TFT according to the second embodiment. As shown in FIG. 11, a TFT according to the second embodiment is an inversely staggered type TFT. The TFT includes a gate electrode 23 formed on a transparent insulating substrate 1, a gate insulating film 3 formed on the transparent insulating substrate 1 including the gate electrode 23, a semiconductor film 73 having two different regions of an amorphous silicon film 71, which is an amorphous portion formed in contact with the gate insulating film 3, and a microcrystalline silicon film 72, which is a crystalline portion, and an amorphous semiconductor layer 83 which is formed on the semiconductor film 73 and formed by laminating an amorphous silicon film 43 and two separate amorphous silicon films 53 including impurities. In other words, the amorphous silicon films 53 including impurities form impurity regions including impurities in the amorphous semiconductor layer 83. The semiconductor film 73 and the amorphous semiconductor layer 83 are patterned in the same shape. In the respective TFTs, a source region 73s and a drain region 73d are formed to generally correspond to the planar regions where the impurity regions made of the two amorphous silicon films 53 exist. Further, a channel region 73c is formed in a region sandwiched between the source region 73s and the drain region 73d. As described in the first embodiment, the two separate impurity regions may be formed by implanting impurities in the portions of the amorphous semiconductor layer 83.

A source electrode 63s and a drain electrode 63d are respectively formed on the amorphous silicon films 53 including impurities in the source region 73s and the drain region 73d. The amorphous silicon films 53 including impurities are respectively formed in contact with the source electrode 63s and the drain electrode 63d below the source electrode 63s and the drain electrode 63d respectively, and the amorphous silicon films 53 are separated in a region other than below the source electrode 63s and the drain electrode 63d. As a result, the source electrode 63s and the drain electrode 63d are connected to the amorphous silicon film 43 and the semiconductor film 73 through the amorphous silicon films 53 including impurities. The amorphous silicon films 53 including impurities serve as reducing contact resistance with the source electrode 63s and the drain electrode 63d. In the channel region 73c, the thickness of the amorphous silicon film 43 is equal to or smaller than the source region 73s and the drain region 73d.

In the channel region 73c, that is, in a region including at least a portion between the region below the source electrode and the region below the drain electrode, the semiconductor film 73 is preferably made of the microcrystalline silicon film 72 which is a crystalline portion. Meanwhile, in the second embodiment, the microcrystalline silicon film 72 is formed to extend the source region 73s and the drain region 73d that is below the source electrode 63s and the drain electrode 63d. Thus, the microcrystalline silicon film 72 is formed across the source region 73s and the drain region 73d, and the semiconductor films 73 in the source region 73s and the drain region 73d are connected through the microcrystalline silicon film 72. The semiconductor film 73 and the amorphous semiconductor layer 83 are patterned in the same shape, so that the source electrode 63s and the drain electrode 63d are formed in contact with the end surfaces of the patterns of the semiconductor film 73 and the amorphous semiconductor layer 83. Specifically, the source electrode 63s and the drain electrode 63d are in contact with the semiconductor film 73 in the region of the semiconductor film 73 where the amorphous silicon film 71 which is an amorphous portion is to be formed. That is, in the region having the end surface in contact with the source electrode 63s and the drain electrode 63d, the semiconductor film 73 becomes the amorphous silicon film 71 which is an amorphous portion.

Figure 12A:
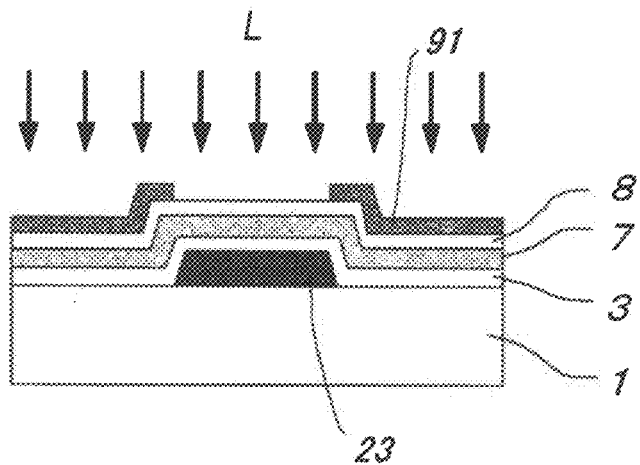
FIGS. 12A to 12C are sectional views illustrating a method of manufacturing a TFT according to the second embodiment of the invention.
Figure 12B:
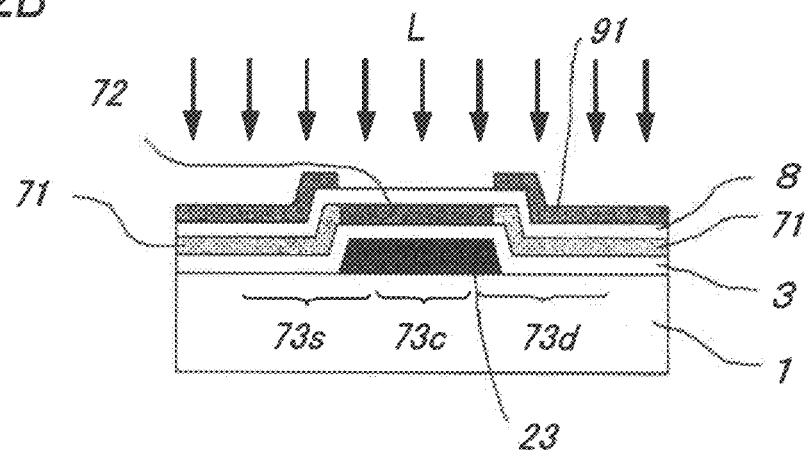

Subsequently, a method of manufacturing a TFT of the second embodiment will be described. The method is similar to the method of manufacturing a TFT in the first embodiment halfway, thus simple description will be provided. First, the gate electrode 23 is formed by patterning on the transparent insulating substrate 1, and the gate insulating film 3, an amorphous silicon film 7 which is an amorphous semiconductor film, and a light-transmissive insulating film 8 are sequentially and continuously formed on the transparent insulating substrate 1 including an upper part of the gate electrode 23. For the gate electrode material, the amorphous semiconductor film, and the insulating film, the same materials as in the first embodiment may be used. Subsequently, as shown in FIG. 12A, a metal film 91 having an opening is formed on the amorphous silicon film 7 and the light-transmissive insulating film 8 by patterning, and the laser irradiation is carried out for both the light-transmissive insulating film 8 in the region exposed by the opening and the metal film 91. Only a difference from the first embodiment is that the patterned shape of the metal film 91 having the opening differs, with regard to the laser irradiation conditions, the same conditions may be selected. As a result, as shown in FIG. 12B, in the portion corresponding to the opening of the metal film 91, a microcrystalline silicon film 72 is formed of the amorphous silicon film 7, and the laser light L is not absorbed into the amorphous silicon film 7 directly below the metal film 91, such that the amorphous silicon film 7 becomes the amorphous silicon film 71. In the second embodiment, the opening is formed to be larger than the region which becomes the channel region 73c (determined by the source electrode 63s and the drain electrode 63d which are to be formed later and the regions where the amorphous silicon films 53 including impurities) are to be formed, such that the microcrystalline silicon film 72 is formed across the regions which become the source region 73s and the drain region 73d.

Figure 12C:
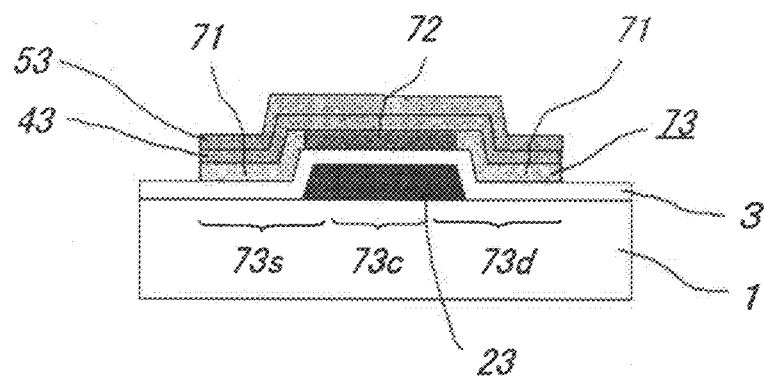

Thereafter, similarly to the first embodiment, removal of the metal film 91 and removal of the light-transmissive insulating film 8 are sequentially carried out, and an amorphous silicon film and an amorphous silicon film including impurities are continuously formed on the amorphous silicon film 71 and the microcrystalline silicon film 72. Subsequently, the semiconductor film 73 having two different regions of the amorphous silicon film 71 and the microcrystalline silicon film 72, the amorphous silicon film 43, and the amorphous silicon film 53 including impurities are patterned and formed simultaneously in desired shapes by a photolithography process and an etching process. Thus, the configuration shown in FIG. 12C is obtained. After the source electrode 63s and the drain electrode 63d are formed by patterning, the entire amorphous silicon film 53 including impurities in the thickness direction and a portion of the amorphous silicon film 43 in the thickness direction between the source electrode 63s and the drain electrode 63d are removed by etching with the source electrode 63s and the drain electrode 63d used as a mask. As a result, the amorphous semiconductor layer 83 is formed in which the amorphous silicon film 43 and the two separate amorphous silicon films 53 including impurities are laminated. Through the above-described process, the TFT of the second embodiment shown in FIG. 11 is completed.

According to the TFT of the second embodiment described above, the metal film 91 having the opening is formed on the semiconductor film 73 by patterning, and microcrystalline silicon is formed only in the region exposed by the opening of the metal film 91 in the semiconductor film 73. Thus, a TFT is realized in which both amorphous silicon and microcrystalline silicon are mixed in a single semiconductor layer. In the channel region 73c of the semiconductor film 73 as an active layer, that is, in the region including at least a portion between the region below the source electrode and the region below the drain electrode, the microcrystalline silicon film 72 which is a crystalline portion is provided, and in other regions, the amorphous silicon film 71 which is an amorphous portion is provided. With this configuration, in at least a portion of the path of the TFT through which an on-current flows, a current can flows mainly in the semiconductor layer having higher mobility than the amorphous silicon film or having lower on-resistance than the amorphous silicon film. As a result, a TFT is obtained which is excellent in on-characteristics compared to a general amorphous TFT, in which the entire semiconductor film 73 as an active layer is formed of the amorphous silicon film 71. Further, the source electrode 63s and the drain electrode 63d are formed to be not in contact with the microcrystalline silicon film 72 compared to a general microcrystalline silicon TFT, in which the entire semiconductor film 73 as an active layer is formed of the microcrystalline silicon film 72. For this reason, there is no case where an off-current increases due to the inflow of leak current though the sidewalls of the source electrode 63s and the drain electrode 63d. Specifically, in the second embodiment, it is structured at low manufacturing cost such that the semiconductor film 73 is prevented from being in contact with the source electrode 63s and the drain electrode 63d, and the semiconductor film 73 and the amorphous semiconductor layer 83 are patterned in the same shape. However, in the region having the end surface in contact with the source electrode 63s and the drain electrode 63d, the semiconductor film 73 is formed of the amorphous silicon film 71 which is an amorphous portion, realizing a structure in which the source electrode 63s and the drain electrode 63d are not in contact with the microcrystalline silicon film 72. As a result, a TFT having good on-characteristics and low off-current can be realized at low manufacturing cost. In the second embodiment, the microcrystalline silicon film 72 is formed across the source region 73s and the drain region 73d. Thus, in the entire path, through which an on-current flows, between the source region 73s and the drain region 73d in the semiconductor film 73, the microcrystalline silicon film 72 can be provided, optimizing the on-characteristics. The TFT of the second embodiment obtained in the above-described manner can be applied to various semiconductor devices or display devices, and can have high on-characteristics and low leak current. Therefore, the TFT may be commonly used for the drive TFT and the pixel TFT described in the first embodiment in various semiconductor devices or display devices. In this case, similarly to the first embodiment and the modification, the drive TFT and the pixel TFT can be arranged to be close to each other. Furthermore, display unevenness can be suppressed, the number of components can be reduced, the liquid crystal display can be reduced in weight, the frame region of the liquid crystal display can be reduced in dimension, and productivity at the time of manufacturing can be improved.

Although in the second embodiment, a case has been described where the TFT is configured such that microcrystalline silicon is formed in the region of the single TFT, for example, in the partial region in the single semiconductor film, and amorphous silicon and microcrystalline silicon are mixed in the single semiconductor film, the scope of the invention is not limited thereto. For example, in the crystallization process of the amorphous semiconductor film, large crystal grains may be formed by controlling the irradiation conditions, such as the laser irradiation energy, the atmosphere at the time of irradiation, and the substrate temperature. That is, the semiconductor film which is formed by the crystallization process is not limited to microcrystalline silicon, polycrystalline silicon may be used. The same advantages as in the second embodiment can be obtained insofar as the semiconductor film is a crystalline semiconductor. From the viewpoint of the wide range of appropriate conditions, ease of manufacturing, and little characteristic variation of the TFT using the resultant crystalline semiconductor film, a microcrystalline semiconductor film is preferable. With regard to the type of semiconductor, although silicon has been described as an example, needless to say, other semiconductors may be used insofar as the semiconductor can be converted from an amorphous semiconductor to a microcrystalline or crystalline semiconductor through the laser irradiation.

Although the embodiment of the invention and the modification have been described, it should be understood that the embodiments are for illustration in all respects and are not limitative. The scope of the invention is defined by the appended claims, and includes equivalents to the claims and all modifications within the appended claims.

What is claimed is:

1. A semiconductor device comprising:
a first gate electrode formed in a first region on a transparent insulating substrate;
a second gate electrode formed in a second region on the transparent insulating substrate;
a gate insulating film, which is formed on the transparent insulating substrate and on both an upper part of the first gate electrode and an upper part of the second gate electrode;
an amorphous semiconductor film, which is formed to contact the gate insulating film in the first region;
a crystalline semiconductor film, which is formed to contact the gate insulating film in the second region;
a first thin-film transistor, which is formed on the amorphous semiconductor film, and which includes a first amorphous semiconductor layer including two separate impurity regions and a second amorphous semiconductor layer; and
a second thin-film transistor, which is formed on the crystalline semiconductor film, and which includes a third amorphous semiconductor layer including two separate impurity regions and a fourth amorphous semiconductor layer,
wherein the first thin-film transistor and the second thin-film transistor are arranged to be near to each other by a distance that is beyond positional accuracy of laser irradiation.

2. A semiconductor device according to claim 1,
wherein at least a side of the gate insulating film contacting the amorphous semiconductor film is made of an oxide film.

3. A thin-film transistor comprising:
a gate electrode formed on a transparent insulating substrate;
a gate insulating film formed on the transparent insulating substrate and on a upper part of the gate electrode;
a semiconductor film, which is formed to be in contact with the gate insulating film, and which includes first region corresponding to an amorphous portion and second region corresponding to a crystalline portion;
an amorphous semiconductor layer, which is formed on the semiconductor film, and which includes two separate impurity regions; and
a source electrode and a drain electrode respectively formed to be in contact with the two impurity regions in the amorphous semiconductor layer,
wherein the crystalline portion of the semiconductor film is formed in a part of the lower part of the source electrode and a part of the lower part of the drain electrode so that the crystalline portion straddles the lower part of the source electrode and the lower part of the drain electrode, and
wherein the source electrode and the drain electrode are formed not to be in contact with the crystalline portion.

4. The thin-film transistor according to claim 3, wherein the semiconductor film and the amorphous semiconductor layer are formed to have the same shape by patterning, wherein the source electrode and the drain electrode are formed in contact with an end surface of the semiconductor film, and wherein a region including the end surface of the semiconductor film correspond to the amorphous portion.

* * * * *